United States Patent
Saitoh et al.

(10) Patent No.: US 8,421,080 B2
(45) Date of Patent: Apr. 16, 2013

(54) THIN-FILM TRANSISTOR ARRAY DEVICE, ORGANIC EL DISPLAY DEVICE, AND METHOD OF MANUFACTURING THIN-FILM TRANSISTOR ARRAY DEVICE

(75) Inventors: Tohru Saitoh, Osaka (JP); Tomoya Kato, Chiba (JP)

(73) Assignees: Panasonic Corporation, Osaka (JP); Panasonic Liquid Crystal Display Co., Ltd., Hyogo (JP)

(*) Notice: Subject to any disclaimer, the term of this patent is extended or adjusted under 35 U.S.C. 154(b) by 37 days.

(21) Appl. No.: 13/274,491

(22) Filed: Oct. 17, 2011

(65) Prior Publication Data

US 2012/0032179 A1 Feb. 9, 2012

Related U.S. Application Data

(63) Continuation of application No. PCT/JP2010/004119, filed on Jun. 21, 2010.

(51) Int. Cl.
*H01L 29/786* (2006.01)
*H01L 21/336* (2006.01)

(52) U.S. Cl.
USPC .......... 257/59; 257/40; 257/66; 257/E29.273; 257/E21.411; 438/158; 438/151; 438/149; 438/157; 438/166

(58) Field of Classification Search .............. 257/40, 257/59, 66, E29.273, E21.411; 438/158, 438/151, 149, 157, 166
See application file for complete search history.

(56) References Cited

U.S. PATENT DOCUMENTS

| | | | |
|---|---|---|---|
| 5,808,318 A | 9/1998 | Masumo et al. | |
| 7,557,376 B2 | 7/2009 | Maki et al. | |
| 7,662,703 B2 | 2/2010 | Moriwaka et al. | |
| 7,935,584 B2 | 5/2011 | Moriwaka et al. | |
| 2001/0049163 A1* | 12/2001 | Yamazaki et al. | 438/158 |
| 2007/0070283 A1 | 3/2007 | Maki et al. | |
| 2007/0188089 A1 | 8/2007 | Choi et al. | |
| 2008/0035926 A1 | 2/2008 | Toyota et al. | |

(Continued)

FOREIGN PATENT DOCUMENTS

| | | |
|---|---|---|
| JP | 10-65180 | 3/1998 |
| JP | 2007-088364 | 4/2007 |
| JP | 2007-219517 | 8/2007 |
| JP | 2008-040192 | 2/2008 |

(Continued)

OTHER PUBLICATIONS

International Search Report for PCT/JP2010/004119, dated Jul. 27, 2010.

*Primary Examiner* — Thinh T Nguyen
(74) *Attorney, Agent, or Firm* — Greenblum & Bernstein, P.L.C.

(57) ABSTRACT

A thin-film transistor array device includes: a driving TFT including a first crystalline semiconductor film including crystal grains having a first average grain size; and a switching TFT including a second crystalline semiconductor film including crystal grains having a second average grain size that is smaller than the first average grain size. The first crystalline semiconductor film and the second crystalline semiconductor film are formed at the same time by irradiating a noncrystalline semiconductor film using a laser beam having a Gaussian light intensity distribution such that a temperature of the noncrystalline semiconductor film is within a range of 600° C. to 1100° C., and the first crystalline semiconductor film is formed such that the temperature of the noncrystalline semiconductor film is within a temperature range of 1100° C. to 1414° C. due to latent heat generated by the laser irradiation.

20 Claims, 22 Drawing Sheets

U.S. PATENT DOCUMENTS

| | | |
|---|---|---|
| 2008/0171410 A1 | 7/2008 | Moriwaka et al. |
| 2008/0318398 A1 | 12/2008 | Moriwaka et al. |
| 2011/0201183 A1 | 8/2011 | Moriwaka et al. |
| 2011/0297950 A1 | 12/2011 | Kato et al. |
| 2011/0318891 A1 | 12/2011 | Oda et al. |

FOREIGN PATENT DOCUMENTS

| | | |
|---|---|---|
| JP | 2008-085317 | 4/2008 |
| JP | 2008-085318 | 4/2008 |
| JP | 2010-147368 | 7/2010 |

* cited by examiner

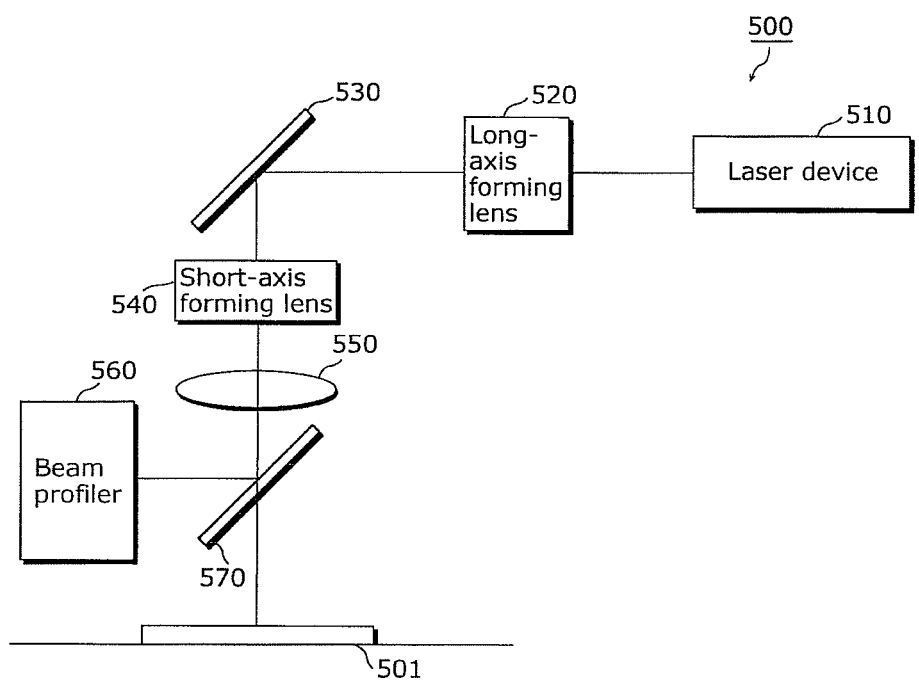

Long-axis profile

Short-axis profile

Short-axis profile

THIN-FILM TRANSISTOR ARRAY DEVICE, ORGANIC EL DISPLAY DEVICE, AND METHOD OF MANUFACTURING THIN-FILM TRANSISTOR ARRAY DEVICE

CROSS REFERENCE TO RELATED APPLICATION

This is a continuation application of PCT application No. PCT/JP2010/004119 filed on Jun. 21, 2010, designating the United States of America.

BACKGROUND OF THE INVENTION (1) Field of the Invention

The present invention relates to a thin-film transistor array device, an organic EL display device, and a method of manufacturing the thin-film transistor array device.

(2) Description of the Related Art

In an active-matrix display device such as a liquid crystal display device or an organic electroluminescence (EL) display device, a thin-film transistor called the TFT is used. In such a display device, thin-film transistors are arranged in an array to constitute a thin-film transistor array device.

Generally, in each thin-film transistor, a semiconductor layer which is made of silicon or the like and is to be a channel portion is formed as an amorphous or crystalline semiconductor film; however, as the semiconductor layer that is to be the channel portion, it is preferable to use the crystalline semiconductor film which has higher mobility than the amorphous semiconductor film. Generally, the crystalline semiconductor film is formed by forming, and then crystallizing, the amorphous semiconductor film.

The method of forming the crystalline semiconductor film by crystallizing the amorphous semiconductor film includes: an excimer laser annealing crystallization (ELA) method; a thermal annealing crystallization method using a Ni catalyst or the like; and a crystallization method using a combination of an infrared semiconductor laser beam and a sample structure having a light absorbing layer.

However, the general crystallization using the ELA method forms a crystalline semiconductor film including microcrystals or polycrystals, thus causing variation in electrical characteristics depending on the size and distribution of crystal grains (crystalline structure). Use of such a crystalline semiconductor film in the TFT causes variation in the characteristics of the TFT.

On the other hand, the thermal annealing method allows uniform crystallization, but processing of a catalyst metal is difficult. In addition, the crystallization method using the combination of the infrared semiconductor laser beam and the sample structure having a light absorbing layer requires a process of forming, and then removing, a light-absorbing layer and a buffer layer on the sample, and this indicates a problem in terms of takt time. Furthermore, there is another problem that the TFT, which is manufactured using the film crystallized by the solid-phase growth method, falls short of targeted electrical characteristics due to a small average grain size of the film.

Thus, in the ELA method, a conventionally suggested technique is to allow control of a crystal grain width in the TFT crystalline semiconductor film (Patent Reference 1: Japanese Unexamined Patent Application Publication No. 2008-85317). In addition, in the ELA method, another suggested technique is to allow control of the direction of the crystalline grain boundary or crystalline grain width in the TFT crystalline semiconductor film (Patent Reference 2: Japanese Unexamined Patent Application Publication No. 2008-85318).

When using the techniques disclosed by Patent References 1 and 2, it is possible to form a crystalline semiconductor film including crystals having a large grain size of 0.5 μm to 10 μm. In addition, by forming a semiconductor element using the film thus formed, it is possible to manufacture a satisfactory semiconductor device with reduced variation between adjacent elements.

SUMMARY OF THE INVENTION

However, Patent References 1 and 2 merely disclose the techniques of forming a crystalline semiconductor film including large crystal grains.

Specifically, in the ELA method, a noncrystalline semiconductor film is crystallized using a pulse-oscillated laser beam (for example, an XeCl excimer laser beam of wavelength $\lambda=308$ nm). In the processing, crystallization occurs after momentarily increasing a temperature of the noncrystalline semiconductor film by irradiating the noncrystalline semiconductor film with the pulse-oscillated excimer layer beam (for irradiation time of the order of nanoseconds) and melting the noncrystalline semiconductor film. However, as described above, the time for irradiation using the pulse-oscillated excimer layer beam is as short as the order of tens to hundreds of nanoseconds. The noncrystalline semiconductor does not crystallize until it is melted by increasing the temperature to a level equal to or above a melting point of the semiconductor film (silicon) (1414° C. or above), but the grain size of crystals varies depending on conditions. Furthermore, volume expansion which occurs in crystallizing the noncrystalline film, that is, volume expansion which occurs during transition from liquid (when melted) to solid (when crystallized), generates surface protrusion in the crystalline semiconductor film after the crystallization, so that the film loses flatness. In other words, this causes in-plane variation in grain size of the crystalline semiconductor film. This causes a problem in the manufacturing process of the thin-film transistor such as an etching process. In addition, to deal with such in-plane variation in the crystalline semiconductor film after crystallization, it is necessary to perform multiple laser shots, which causes problems of costs and takt time.

In addition, in the thin-film transistor having such a crystalline semiconductor film, for example, variation is caused in current that flows between source and drain electrodes when voltage is applied to the gate electrode. For example, when such a thin-film transistor as described above is included in a current-driven display device such as an organic EL display device, gradation control is performed on the organic EL device through current, and thus variation in current amount leads directly to variation in display image. Thus, it is not possible to obtain a high-precision image. In addition, in the thin-film transistor described above, the protrusion generated in the crystalline semiconductor film causes leakage current between the source and drain electrodes, thus deteriorating the TFT characteristics.

It should be noted that, of the problems of the ELA method described above, Patent References 1 and 2 above neither solve nor suggest the problem of such surface protrusion although grain size control is disclosed therein.

An object of the present invention, conceived in view of the above problems, is to provide a method of manufacturing a thin-film transistor array device and an organic EL display device which include a crystalline semiconductor film having a crystalline structure with satisfactory intra-plane uniformity, and include a crystalline semiconductor film including crystal grains of different sizes, and a method of manufacturing such a thin-film transistor array device.

To solve the problems above, a thin-film transistor array device according to an aspect of the present invention is a thin-film transistor array device including: a substrate; a first gate electrode provided above the substrate; a second gate electrode provided above the substrate and in parallel with the first gate electrode; a gate insulating film provided on the first gate electrode and second gate electrode; a first crystalline semiconductor film provided on the gate insulating film and above the first gate electrode, the first crystalline semiconductor film being made of silicon and including crystal grains having a first average grain size; a first source electrode and a first drain electrode which are formed above the first crystalline semiconductor film; a second crystalline semiconductor film provided on the gate insulating film and above the second gate electrode, the second crystalline semiconductor film being made of silicon and including crystal grains having a second average grain size which is smaller than the first average grain size; and a second source electrode and a second drain electrode which are formed above the second crystalline semiconductor film, and in the thin-film transistor array device, the crystal grains of the first crystalline semiconductor film are formed by: a first process of irradiating, with a continuous wave laser, a noncrystalline semiconductor film made of silicon such that a temperature of the noncrystalline semiconductor film is within a temperature range of 600° C. to 1100° C., the continuous wave laser having a continuous light intensity distribution that is convex upward in each of long and short axes; a second process of crystallizing the noncrystalline semiconductor film according to the temperature range of 600° C. to 1100° C.; and a third process of increasing a grain size of the crystal grains of the noncrystalline semiconductor film that becomes crystallized according to a temperature range of 1100° C. to 1414° C., when the temperature of the noncrystalline semiconductor film increases from 1100° C. to 1414° C. due to latent heat which is generated when the noncrystalline semiconductor film becomes crystallized by the laser irradiation, the continuous light intensity distribution that is convex upward in the long axis is predetermined such that a portion in which the temperature of the noncrystalline semiconductor film increases from 1100° C. to 1414° C. due to the latent heat has a constant width, in the third process, the crystal grains of the first crystalline semiconductor film are further formed using an inner region having the constant width, the inner region being included in the continuous light intensity distribution that is convex upward in the long axis and is predetermined as having the constant width, the crystal grains of the second crystalline semiconductor film are formed according to the same processing as in the first and second processes, using the laser irradiation performed in the first and second processes, and the crystal grains of the second crystalline semiconductor film are further formed using an outer region which is located outside the inner region having the constant width, the outer region being included in the continuous light intensity distribution that is convex upward in the long axis and is predetermined as having the constant width.

A thin-film transistor array device according to an aspect of the present invention includes a first crystalline semiconductor film having satisfactory in-plane uniformity without protrusion in the surface and having a crystalline structure including relatively large crystal grains, and a second crystalline semiconductor film having satisfactory in-plane uniformity without protrusion in the surface and having a crystalline structure including smaller crystal grains than those of the first crystalline semiconductor film. With this, by applying the first crystalline semiconductor film as a channel portion of a driving TFT and the second crystalline semiconductor film as a channel portion of a switching TFT, it is possible to increase ON current of the driving TFT as well as suppressing OFF current of the switching TFT.

In addition, according to the method of manufacturing the thin-film transistor array device in an aspect of the present invention, it is possible to collectively form, by laser irradiation according to the temperature range, the first crystalline semiconductor film including relatively large crystal grains and the second crystalline semiconductor film including relatively small crystal grains, with high intra-plane uniformity without protrusion in the surface. With this, it is possible to form, through a smaller number of processes, the first crystalline semiconductor film appropriate for the channel portion of the driving TFT and the second crystalline semiconductor film appropriate for the channel portion of the switching TFT.

FURTHER INFORMATION ABOUT TECHNICAL BACKGROUND TO THIS APPLICATION

The disclosure of PCT application No. PCT/JP2010/004119 filed on Jun. 21, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 1 is a diagram showing an example configuration of a CW laser beam crystallization device in an embodiment of the present invention;

DESCRIPTION OF THE PREFERRED EMBODIMENT

Figure 2A:
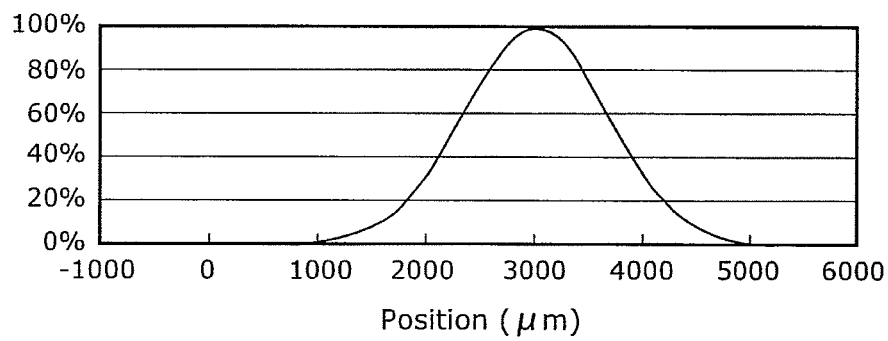
FIG. 2A is a diagram showing a long-axis profile of the CW laser beam in the embodiment of the present invention.

A thin-film transistor array device according to an aspect of the present invention is a thin-film transistor array device including: a substrate; a first gate electrode provided above the substrate; a second gate electrode provided above the substrate and in parallel with the first gate electrode; a gate insulating film provided on the first gate electrode and second gate electrode; a first crystalline semiconductor film provided on the gate insulating film and above the first gate electrode, the first crystalline semiconductor film being made of silicon and including crystal grains having a first average grain size; a first source electrode and a first drain electrode which are formed above the first crystalline semiconductor film; a second crystalline semiconductor film provided on the gate insulating film and above the second gate electrode, the second crystalline semiconductor film being made of silicon and including crystal grains having a second average grain size which is smaller than the first average grain size; and a second source electrode and a second drain electrode which are formed above the second crystalline semiconductor film, in the thin-film transistor array device, the crystal grains of the first crystalline semiconductor film are formed by: a first process of irradiating, with a continuous wave laser, a noncrystalline semiconductor film made of silicon such that a temperature of the noncrystalline semiconductor film is within a temperature range of 600° C. to 1100° C., the continuous wave laser having a continuous light intensity distribution that is convex upward in each of long and short axes; a second process of crystallizing the noncrystalline semiconductor film according to the temperature range of 600° C. to 1100° C.; and a third process of increasing a grain size of the crystal grains of the noncrystalline semiconductor film that becomes crystallized according to a temperature range of 1100° C. to 1414° C., when the temperature of the noncrystalline semiconductor film increases from 1100° C. to 1414° C. due to latent heat which is generated when the noncrystalline semiconductor film becomes crystallized by the laser irradiation, the continuous light intensity distribution that is convex upward in the long axis is predetermined such that a portion in which the temperature of the noncrystalline semiconductor film increases from 1100° C. to 1414° C. due to the latent heat has a constant width, in the third process, the crystal grains of the first crystalline semiconductor film are further formed using an inner region having the constant width, the inner region being included in the continuous light intensity distribution that is convex upward in the long axis and is predetermined as having the constant width, the crystal grains of the second crystalline semiconductor film are formed according to the same processing as in the first and second processes, using the laser irradiation performed in the first and second processes, and the crystal grains of the second crystalline semiconductor film are further formed using an outer region which is located outside the inner region having the constant width, the outer region being included in the continuous light intensity distribution that is convex upward in the long axis and is predetermined as having the constant width.

In the present aspect, the first crystalline semiconductor film in a first thin-film transistor and the second crystalline semiconductor film in a second thin-film transistor that is provided separately from the first thin-film transistor are collectively formed using a continuous wave laser having a continuous light intensity distribution that is convex upward.

The first crystalline semiconductor film in the first thin-film transistor is formed by irradiating the noncrystalline semiconductor film with a laser with output density such that the temperature of the noncrystalline semiconductor film is within a range of 600° C. to 1100° C., using an inner region having a constant width in the light intensity distribution. In other words, latent heat, which is generated when the noncrystalline semiconductor film becomes crystallized by the laser irradiation, increases the temperature of the noncrystalline semiconductor film at the portion irradiated with the laser such that the temperature of the irradiated portion instantaneously increases from 600° C. to 1100° C., using the inner region having the constant width in the light intensity distribution. In this processing, when the noncrystalline semiconductor film is made of amorphous silicon, it is possible to form the first crystalline semiconductor film which is a polycrystalline semiconductor film formed with temperature beyond a temperature (1100° C.) considered as a melting point of the amorphous silicon which varies depending on an atomic network structure in the amorphous silicon, and within the temperature range up to 1414° C. that is the melting point of the crystalline silicon, and having a crystalline structure whose grain size is slightly increased from a size of crystals obtained in solid-phase growth after the temperature increases, and constant flatness without surface protrusion.

In addition, the second crystalline semiconductor film in the second thin-film transistor is formed by irradiating the noncrystalline semiconductor film with a laser, using an outer region that is located outside the inner region having the constant width in the light intensity distribution. Specifically, when performing laser irradiation on a predetermined portion of the noncrystalline semiconductor film with a laser such that the temperature of the noncrystalline semiconductor film is within 600° C. to 1100° C., using the inner region having the constant width in the light intensity distribution, the temperature of the portion of the noncrystalline semiconductor, which is irradiated with the laser beam using the outer region that is located outside the inner region having the constant width in the light intensity distribution, increases from the 600° C. to 1100° C., to cause crystallization of the noncrystalline semiconductor film. With this, it is possible to form the second crystalline semiconductor film that is a polycrystalline semiconductor film having an average grain size smaller than that of the first crystalline semiconductor and having constant surface flatness.

With this, by applying the first crystalline semiconductor film as a channel portion of a driving TFT and the second crystalline semiconductor film applied as a channel portion of a switching TFT, it is possible to increase ON current of the driving TFT and also to suppress OFF current of the switching TFT.

Furthermore, in the thin-film transistor array device according to an aspect of the present invention, it is preferable that, when maximum light intensity in the light intensity distribution is 100%, the inner region having the constant width in the light intensity distribution have a range of light intensity of 80% or above, and that the outer region that is located outside the inner region having the constant width in the light intensity distribution have a range of light intensity from 50% to below 80%.

With this, it is possible to form, in a desired average grain size, each of the first crystalline semiconductor film including crystal grains having a first average grain size and the second crystalline semiconductor film including crystal grains having a second average grain size that is smaller than the first average grain size.

Furthermore, in the thin-film transistor array device according to an aspect of the present invention, it is preferable that the first average grain size be from 40 nm to 60 nm.

According to the present aspect, the first average grain size in the first crystalline semiconductor film is assumed to be within a range of 40 nm to 60 nm. This allows realizing high ON current in the TFT including the first crystalline semiconductor film as the channel portion.

Furthermore, in the thin-film transistor array device according to an aspect of the present invention, it is preferable that the second average grain size be from 25 nm to 35 nm.

According to the present aspect, the second average grain size in the second crystalline semiconductor film is assumed to be within a range of 25 nm to 35 nm. This allows the TFT including the second crystalline semiconductor film as the channel portion to obtain higher ON current than a TFT including the noncrystalline semiconductor film such as an amorphous silicon film as the channel portion, and also allows lower OFF current than a TFT including a semiconductor film having a grain size larger than the second average grain size.

Furthermore, in the thin-film transistor array device according to an aspect of the present invention, it is preferable that the first crystalline semiconductor film include mixed crystal having a noncrystalline structure and a crystalline structure.

According to the present aspect, the first crystalline semiconductor film is a crystalline semiconductor film including mixed crystal having both a noncrystalline structure and a crystalline structure, and includes, for example, a portion including crystal grains having an average grain size of 40 nm to 60 nm, and a portion having an amorphous structure that is present around the crystal grains. With this, it is possible to reduce surface roughness.

Furthermore, in the thin-film transistor array device according to an aspect of the present invention, it is preferable that the second crystalline semiconductor film include mixed crystal having a noncrystalline structure and a crystalline structure.

With this, the second crystalline semiconductor film is a crystalline semiconductor film including mixed crystal having both a noncrystalline structure and a crystalline structure, and includes, for example, a portion including crystal grains having an average grain size of 25 nm to 35 nm, and a portion having a noncrystalline structure that is present around the crystal grains. With this, it is possible to reduce surface roughness.

Furthermore, in the thin-film transistor array device according to an aspect of the present invention, it is preferable that the second source electrode and the second drain electrode be electrically connected to the first gate electrode.

With this, it is possible to connect, with a shortest wiring length, the first thin-film transistor having the first crystalline semiconductor film as the channel portion and the second thin-film transistor that is separately provided and includes the second crystalline semiconductor film as the channel portion. As a result, it is possible to minimize electric resistance between the first thin-film transistor and the second thin-film transistor. Thus, it is possible to realize a thin-film transistor array device which operates at high speed with smaller power loss.

In addition, an organic EL display device according to an aspect of the present invention is an organic EL display device including the thin-film transistor array device according to an aspect of the present invention as described above, and the organic EL display device includes: a thin-film transistor array substrate on which the thin-film transistor array device is provided in each of a plurality of pixels; an interlayer insulating film provided above the thin-film transistor array substrate; a lower electrode provided, in each of the plurality of pixels, above the interlayer insulating film; a contact connecting the thin-film transistor array device and the lower electrode; a bank provided above the interlayer insulating film and having an opening; an organic luminescent layer formed in the opening of the bank; and an upper electrode provided above the organic luminescent layer, and in the organic EL display device, the first crystalline semiconductor film included in the thin-film transistor array device is included in a channel layer of a driving transistor in a drive circuit which controls luminescence of the pixels, and the second crystalline semiconductor film included in the thin-film transistor array device is included in a channel layer of a switching transistor in the drive circuit.

In the present aspect, in the drive circuit which controls pixel luminescence, the channel portion of the driving TFT includes the first crystalline semiconductor film, and the channel portion of the switching TFT includes the second crystalline semiconductor film.

Since this allows increasing the average grain size of the first crystalline semiconductor film in the driving TFT, for example, from approximately 40 nm to 60 nm, it is possible to increase the current flowing in the channel portion in the driving TFT. As a result, it is possible to increase current for pixel luminescence, thus allowing increase in luminescence brightness of an organic EL display device.

In addition, since this allows increasing the average grain size of the second crystalline semiconductor film in the switching TFT, for example, from approximately 25 nm to 35 nm, it is possible to obtain higher ON current than a TFT including the noncrystalline semiconductor film such as an amorphous silicon film as the channel portion, and also allows lower OFF current than a TFT including a semiconductor film having a grain size that is larger than the second average grain size. As a result, it is possible to realize an organic EL display device having an advantage in motion picture characteristics. Thus, it is possible to realize an organic EL display device that achieves high-level luminescence brightness and high-speed display.

In addition, a method of manufacturing a thin-film transistor array device according to an aspect of the present invention is a method of manufacturing a thin-film transistor array device, including: a first process of preparing a substrate; a second process of forming a first gate electrode above the substrate; a third process of forming a second gate electrode above the substrate and in parallel with the first gate electrode; a fourth process of forming a gate insulating film on the first gate electrode and second gate electrode; a fifth process of forming, at the same time, a first crystalline semiconductor film on the gate insulating film and above the first gate electrode, and a second crystalline semiconductor film on the gate insulating film and above the second gate electrode, the first crystalline semiconductor film being made of silicon and including crystal grains having a first average grain size, and the second crystalline semiconductor film being made of silicon and including crystal grains having a second average grain size which is smaller than the first average grain size; and a sixth process of forming a first source electrode and a first drain electrode above the first crystalline semiconductor film, and forming a second source electrode and a second drain electrode above the second crystalline semiconductor film, and in the method of manufacturing a thin-film transistor array device, in the fifth process, the crystal grains of the first crystalline semiconductor film are formed by: a 5-1 process of irradiating, with a continuous wave laser, a noncrystalline semiconductor film made of silicon such that a temperature of the noncrystalline semiconductor film is within a temperature range of 600° C. to 1100° C., the continuous wave laser having a continuous light intensity distribution that is convex upward in each of long and short axes; a 5-2 process of crystallizing the noncrystalline semiconductor film according to the temperature range of 600° C. to 1100° C.; and a 5-3 process of increasing a grain size of the crystal grains of the noncrystalline semiconductor film crystallized according to a temperature range of 1100° C. to 1414° C., when the temperature of the noncrystalline semiconductor film increases from 1100° C. to 1414° C. due to latent heat which is generated when the noncrystalline semiconductor film becomes crystallized by the laser irradiation, the continuous light intensity distribution that is convex upward in the long axis is predetermined such that a portion in which the temperature of the noncrystalline semiconductor film increases from 1100° C. to 1414° C. due to the latent heat has a constant width, in the 5-3 process, the crystal grains of the first crystalline semiconductor film are further formed using an inner region having the constant width, the inner region being included in the continuous light intensity distribution that is convex upward in the long axis and is predetermined as having the constant width, the crystal grains of the second crystalline semiconductor film are formed according to the same processing as in the 5-1 and 5-2 processes, using the laser irradiation performed in the 5-1 and 5-2 processes, and the crystal grains of the second crystalline semiconductor film are further formed using an outer region which is located outside the inner region having the constant width, the outer region being included in the continuous light intensity distribution that is convex upward in the long axis and is predetermined as having the constant width.

Conventionally, in the case of crystallizing the noncrystalline semiconductor film such as amorphous silicon using a pulse-oscillated laser such as an excimer layer, crystallization does not occur unless the temperature of the noncrystalline semiconductor film is 1414° C. or above. Accordingly, the noncrystalline semiconductor film, after it is solved and crystallized, has an average grain size of 70 nm to 1000 nm. The semiconductor film, thus solved and crystallized, has protrusion in the surface and loses surface flatness. This, as a result, causes variation in each semiconductor film included in the TFT, and causes variation in electrical characteristics such as variation in current amount between each TFT. Since a current-driven display device such as an organic EL device performs gradation control through current, such variation in current amount is directly linked to variation in images, which does not allow obtaining a high-precision image. In addition, protrusion generated in the semiconductor film causes leakage current between the source electrode and the drain electrode at the time of gate off, thus deteriorating the characteristics of the TFT.

It should be noted that although it is possible to momentarily increase the temperature of the noncrystalline semiconductor film up to 1414° C. or below by shooting a pulse-oscillated laser in nanosecond order-time, the irradiation time is extremely short. The noncrystalline semiconductor film, when irradiated for a short time, does not shift from an amorphous state to a crystallized state. In addition, even when performing irradiation using a pulse-oscillated laser in nanosecond-order time, such irradiation only results in forming a portion at which the noncrystalline semiconductor film has a temperature of 1414° C. or above and a portion at which the noncrystalline semiconductor film has a temperature of 1414° C. or below. In other words, the noncrystalline semiconductor film in an upper portion in the noncrystalline semiconductor film is solved to become crystallized, and the noncrystalline semiconductor film in a lower portion of the noncrystalline semiconductor film becomes crystallized without being solved. In this context, since the noncrystalline semiconductor film is solved and crystallized in the upper portion of the noncrystalline semiconductor film, a crystalline structure having an average grain size of 50 nm or below is generated, thus causing protrusion in the surface of the crystalline semiconductor film. In this case, despite the decrease in grain size, the leakage current, which is caused by the protrusion generated in the crystalline semiconductor film, causes deterioration in the characteristics of the TFT.

Thus, in the present aspect of the present invention, the first crystalline semiconductor film in the first thin-film transistor and the second crystalline semiconductor film in the second thin-film transistor that is provided separately from the first thin-film transistor are collectively formed using a continuous wave laser having a continuous light intensity distribution that is convex upward.

In this processing, the first crystalline semiconductor film in the first thin-film transistor is formed by irradiating the noncrystalline semiconductor film with a laser with output density such that the temperature of the noncrystalline semiconductor film is within the range of 600° C. to 1100° C., using an inner range having a constant width in the light intensity distribution. In other words, latent heat, which is generated when the noncrystalline semiconductor film becomes crystallized by the laser irradiation, increases the temperature of the noncrystalline semiconductor film in the portion irradiated with the laser such that the temperature of the irradiated portion instantaneously increases from 600° C. to 1100° C., using the inner region having the constant width in the light intensity distribution of the laser beam. In this processing, when the noncrystalline semiconductor film is made of amorphous silicon, it is possible to form the first crystalline semiconductor film which is a polycrystalline semiconductor film formed with temperature beyond a temperature (1100° C.) considered as a melting point of the amorphous silicon which varies depending on an atomic network structure in the amorphous silicon, and within the temperature range up to 1414° C. that is the melting point of the crystalline silicon, and having a crystalline structure whose grain size is slightly increased from the size of crystals obtained in solid-phase growth after the temperature increases, and constant flatness without surface protrusion.

In addition, the second crystalline semiconductor film in the second thin-film transistor is formed by irradiating the noncrystalline semiconductor film with a laser, using an outer region located outside the inner region having the constant width in the light intensity distribution. Specifically, when irradiating a predetermined portion of the noncrystalline semiconductor film with a laser so that the temperature of the noncrystalline semiconductor film is within 600° C. to 1100° C., using the inner region having a constant width in the light intensity distribution, the temperature of the portion, which is irradiated with the laser beam using the outer region having a constant width in the light intensity distribution, increases from the 600° C. to 1100° C., thus causing crystallization of the noncrystalline semiconductor film. With this, it is possible to form the second crystalline semiconductor film that is a polycrystalline semiconductor film having an average grain size smaller than that of the first crystalline semiconductor and having constant surface flatness.

This allows manufacturing of a thin-film transistor array device which includes: the first crystalline semiconductor film which obtains satisfactory ON current and is appropriate for the channel portion of the driving TFT, and the second crystalline semiconductor film which can suppress OFF current and is appropriate for the channel portion of the switching TFT.

Furthermore, in the method of manufacturing a thin-film transistor array device according to an aspect of the present invention, when maximum light intensity in the light intensity distribution is 100%, it is preferable that the inner region having the constant width in the light intensity distribution have a range of light intensity of 80% or above, and that the outer region that is located outside the inner region having the constant width in the light intensity distribution have a range of light intensity from 50% to below 80%.

With this, it is possible to form, in a desired average grain size, each of the first crystalline semiconductor film including crystal grains having a first average grain size and the second crystalline semiconductor film including crystal grains having a second average grain size that is smaller than the first average grain size.

Furthermore, it is preferable that the method of manufacturing a thin-film transistor array device according to an aspect of the present invention further include a process of spacing the first crystalline semiconductor film from the second crystalline semiconductor film, the process being performed between the 5-3 process and the sixth process.

This prevents carriers of electrons or holes from flowing into the first crystalline semiconductor film and the second crystalline semiconductor film. As a result, it is possible to operate, without mutual interference, the first thin-film transistor including the first crystalline semiconductor film as the channel portion and the second thin-film transistor including the crystalline semiconductor film as the channel portion.

Furthermore, in the method of manufacturing a thin-film transistor array device according to an aspect of the present invention, it is preferable that, in the process of spacing the first crystalline semiconductor film from the second crystalline semiconductor film, a boundary portion between the first crystalline semiconductor film and the second crystalline semiconductor film be removed by patterning.

According to the present aspect, the first crystalline semiconductor film and the second crystalline semiconductor film are spaced from each other, by removing the boundary portion between the first crystalline semiconductor film and the second crystalline semiconductor film.

Furthermore, in the method of manufacturing a thin-film transistor array device according to an aspect of the present invention, it is preferable that the first average grain size be from 40 nm to 60 nm.

According to the present aspect, the first average grain size in the first crystalline semiconductor film is assumed to be within a range of 40 nm to 60 nm. With this, in the TFT including the first crystalline semiconductor film as the channel portion, it is possible to realize high ON current.

Furthermore, in the method of manufacturing a thin-film transistor array device according to an aspect of the present invention, it is preferable that the second average grain size be from 25 nm to 35 nm.

According to the present aspect, the second average grain size in the second crystalline semiconductor film is assumed to be within a range of 25 nm to 35 nm. This allows the TFT including the second crystalline semiconductor film as the channel portion to obtain higher ON current than a TFT including the noncrystalline semiconductor film such as an amorphous silicon film as the channel portion, and also allows lower OFF current than a TFT including the semiconductor film having a larger grain size than the second average grain size.

Furthermore, in the method of manufacturing a thin-film transistor array device according to an aspect of the present invention, it is preferable that the continuous light intensity distribution that is convex be a Gaussian distribution.

This allows performing desired laser irradiation according to the inner region having the constant width within Gaussian light intensity distribution and the outer region. Accordingly, it is possible to form, in a desired average grain size, each of the first crystalline semiconductor film including crystal grains having a first average grain size and the second crystalline semiconductor film including crystal grains having a second average grain size that is smaller than the first average grain size.

Furthermore, in the method of manufacturing a thin-film transistor array device according to an aspect of the present invention, it is preferable that, in the 5-1 process, the laser irradiation be performed on the noncrystalline semiconductor film such that the temperature of the noncrystalline semiconductor film is within the temperature range of 600° C. to 800° C.

Thus, even when the temperature range of the noncrystalline semiconductor film in the first process is set to 600° C. to 800° C., an equivalent advantageous effect can be produced as in the case of setting the temperature range to 600° C. to 1100° C.

Furthermore, in the method of manufacturing a thin-film transistor array device according to an aspect of the present invention, it is preferable that, in the 5-1 process, the laser irradiation be performed on the noncrystalline semiconductor film for microsecond-order time.

Since this increases the irradiation time for irradiating the noncrystalline semiconductor film with a continuous wave laser beam, it is possible to secure sufficient time for which the atomic structure becomes crystallized from the amorphous state and the atoms are further rearranged from the amorphous state.

Furthermore, in the method of manufacturing a thin-film transistor array device according to an aspect of the present invention, it is preferable that, in the 5-1 process, the laser irradiation to the noncrystalline semiconductor film be performed for 10 to 100 microseconds.

Since this increases the irradiation time for irradiating the noncrystalline semiconductor film with a continuous wave laser beam, it is possible to secure sufficient time for the atomic structure to be rearranged from the amorphous state into crystals.

Embodiment

Hereinafter, a thin-film transistor array device, an organic EL display device, and a method of manufacturing the thin-film transistor array device will be described with reference to the drawings. It should be noted that each figure is a schematic diagram for description, and a film thickness, a dimensional ratio of each unit, and so on are not necessarily drawn with precision.

(CW Laser Beam Crystallization Device)

First, a CW laser beam crystallization device 500 which is used for manufacturing a thin-film transistor array according to an embodiment of the present invention will be described with reference to the drawings.

Figure 2B:
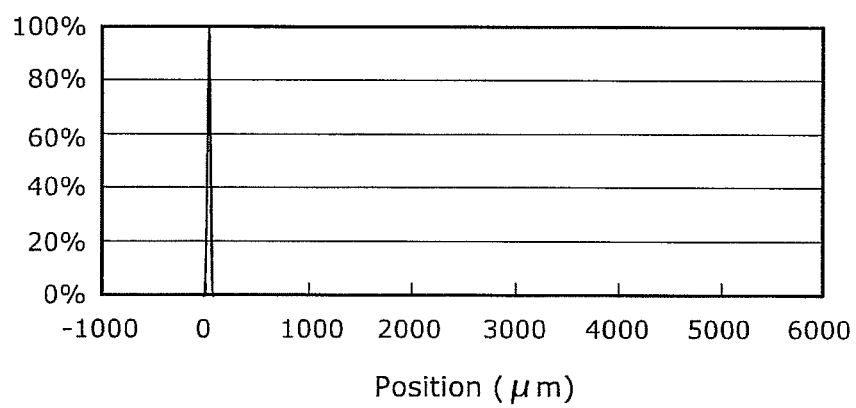
FIG. 2B is a diagram showing a short-axis profile of the CW laser beam in the embodiment of the present invention.
Figure 2C:
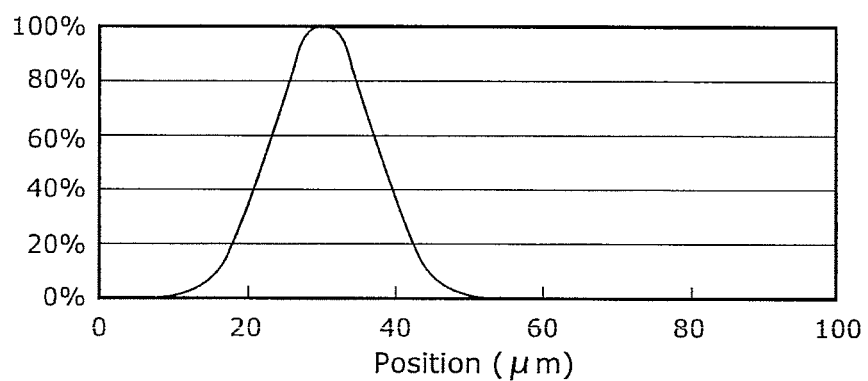
FIG. 2C is a short-axis profile of the CW laser beam in the embodiment of the present invention (enlarged view of FIG. 2B)

FIG. 1 is a diagram showing an example configuration of a CW laser crystallization device according to the embodiment of the present invention. FIG. 2A is a diagram showing a long-axis profile of the CW laser beam in the present embodiment. FIGS. 2B and 2C are diagrams each showing a short-axis profile of the CW laser beam in the present embodiment, and FIG. 2C is a view (enlarged view) with a position range reduced in size from FIG. 2B.

As shown in FIG. 1, the CW laser beam crystallization device 500 in the present embodiment is a device which irradiates a sample 501 in which a noncrystalline semiconductor film such as an amorphous silicon film is formed on a glass substrate, using a continuous wave (CW) laser beam for microsecond-order time. The CW laser beam crystallization device 500 includes: a laser device 510, a long-axis forming lens 520, a mirror 530, a short-axis forming lens 540, a collection lens 550, a beam profiler 560, and silica glass 570.

The laser device 510 oscillates a CW laser beam that is a continuous wave laser beam. In addition, in the present embodiment, the laser device 510 oscillates, for example, a green laser beam or a blue laser beam for a relatively long time that is 10 to 100 microseconds, instead of oscillating for a period of time as short as 10 to 100 nanoseconds.

In the CW laser beam crystallization device 500, the CW laser beam oscillated by the laser device 510 passes through the long-axis forming lens 520, to have the irradiation direction changed by the mirror 530. The CW laser beam, having the irradiation direction changed by the mirror 530, passes through the short-axis forming lens 540, and is collected by the collection lens 550 to be projected onto the sample 501. In addition, a most part of the CW laser beam collected by the collection lens 550 passes through the silica glass 570 to be projected onto the sample 501, but another part of the CW laser beam collected by the collection lens 550 enters the beam profiler 560, which measures a beam profile.

Here, as shown in FIGS. 2A to 2C, the beam profile of the CW laser beam collected by the collection lens 550, that is, the beam profile of the CW laser beam projected onto the sample 501 by the CW laser beam crystallization device 500, has a Gaussian light intensity distribution in both long and short axes. However, as shown in FIGS. 2A and 2B, a light intensity distribution in the long-axis indicates a Gaussian distribution at a wide range of positions from 0 μm to 6000 μm, with respect to the short axis. In addition, as shown in FIGS. 2B and 2C, the light intensity distribution in the short-axis indicates a Gaussian distribution at a narrow range of positions from 0 μm to 60 μm. It should be noted that in FIGS. 2A to 2C, the vertical axis represents relative intensity when assuming laser beam intensity as 100% at a point which indicates a largest laser beam intensity in the CW laser beam profile.

Thus, the beam profile of the CW laser beam collected by the collection lens 550 has a Gaussian light intensity distribution in both long and short axes. This light intensity distribution is formed when the CW laser beam oscillated by the laser device 510 passes though the short-axis forming lens 540 and the long-axis forming lens 520. In addition, based on the beam profile measured by the beam profiler 560, it is possible to adjust the long-axis forming lens 520 and the short-axis forming lens 540 such that the beam profile of the CW laser beam represents a Gaussian distribution in both long and short axes.

Note that the beam profile of the CW laser beam collected by the collection lens 550 and projected onto the sample 501 typically has a Gaussian light intensity distribution, but this is not the only case. For the CW laser beam to be projected onto the sample 501, the beam only needs to indicate a bell-shaped continuous light intensity distribution that is convex upward.

Here, the following will describe the reason for considering, as typical, the case where the beam profile of the CW laser beams, collected by the collection lens 550, has a Gaussian light intensity distribution in both long and short axes. The intensity distribution of the CW laser beam oscillated by a CW laser beam oscillation device originally corresponds to a Gaussian distribution or an equivalent to this. Since it is not necessary to introduce a special additional device or part into an optical system of the CW laser beam crystallization device 500, it is possible to perform, relatively easily, irradiation of the CW laser beam having a beam profile which represents a Gaussian light intensity distribution in both long and short axes.

(Crystallization of Noncrystalline Semiconductor Film Using CW Laser Beam)

Next, the following will describe a method of irradiating the noncrystalline semiconductor film with the CW laser beam, using the CW laser beam crystallization device 500, so as to obtain a crystalline semiconductor film having no surface protrusion and including two portions having different grain sizes. It should be noted that, for comparison, the case of forming an amorphous semiconductor into a crystalline semiconductor using the conventional CW laser beam will also be described.

It should be noted that, for comparison, the case of forming an amorphous semiconductor into a crystalline semiconductor using the conventional CW laser beam will also be described with reference to FIGS. 3A and 3B and FIG. 4.

Figure 3A:
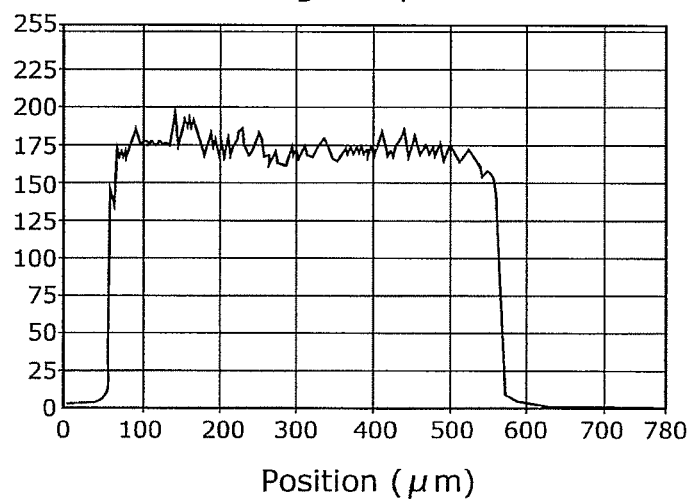
FIG. 3A is a diagram showing a long-axis profile of the conventional CW laser beam.

FIG. 3A is a diagram showing a long-axis profile of the conventional CW laser beam. FIG. 3B is a diagram showing a short-axis profile of the conventional CW laser beam. FIG. 4 is a schematic diagram for describing crystallization using the conventional CW laser beam, and FIG. 4(*a*) is a cross-sectional view of the beam profile in the long-axis direction of the conventional CW laser beam. In addition, FIG. 4(*b*) is a diagram indicating a temperature distribution along a cross section (X-X' cross section in FIG. 4(*c*)) of the amorphous semiconductor film irradiated with a laser. In addition, FIG. 4(*c*) is a diagram schematically showing a surface state of the amorphous semiconductor film irradiated with a laser. It should be noted that a vertical axis in FIG. 4(*b*) represents energy (heat), and a horizontal axis t in FIG. 4(*c*) represents time course.

Here, a solid phase crystallization (SPC) range is a temperature range in which the noncrystalline semiconductor film becomes crystallized within a range equal to or below a melting point of amorphous silicon, that is, a temperature range of 600° C. to 1100° C. In other words, SPC is a phenomenon in which crystallization occurs by solid-state growth at a temperature range equal to or below the melting point of amorphous silicon, that is, the temperature range of 600° C. to 1100° C. The silicon crystalline structure generated by SPC has a flat surface having, for example, an average grain size of 30 nm.

In addition, an explosive nucleation (Ex) range is a temperature range in which the noncrystalline semiconductor film becomes crystallized within a range that is equal to or above the melting point of amorphous silicon and is equal to or below the melting point of silicon, that is, a temperature range of 1100° C. to 1414° C. In other words, Ex is a phenomenon in which crystallization occurs, after a supercooled liquid state, at a temperature range that is equal to or above the melting point of amorphous silicon and is equal to or below the melting point of silicon, that is, the temperature range of 1100° C. to 1414° C. The silicon crystalline structure generated by Ex has a flat surface having, for example, an average grain size of 40 to 60 nm.

In addition, a melting range is the melting point of silicon, that is, the temperature range of 1414° C. or above. It should be noted that crystallizing the amorphous silicon according to the melting range results in p-Si (polycrystalline silicon) having an average grain size of approximately 500 nm, and causes protrusions in the surface.

Figure 3B:
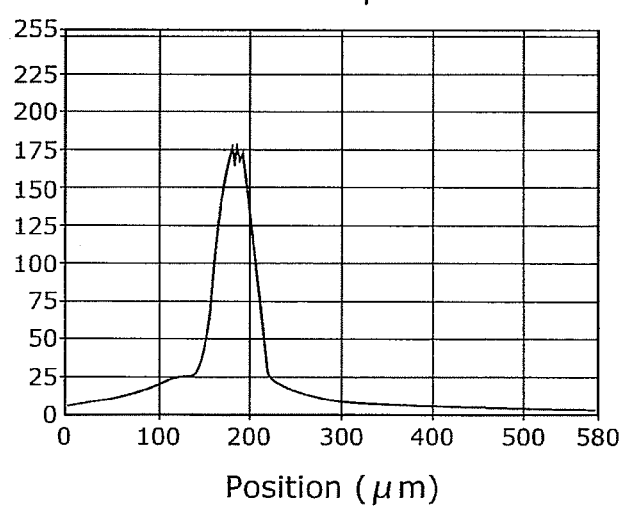
FIG. 3B is a diagram showing a short-axis profile of the conventional CW laser beam.

As shown in FIGS. 3A and 3B, the conventional CW laser beam has a Gaussian light intensity distribution in short axis, but has a flat-topped light intensity distribution in long axis.

The case of irradiating the amorphous semiconductor film with the conventional CW laser beam (hereinafter, described as "the long-axis flat-topped CW laser beam") will be described with reference to FIG. 4.

Figure 4:
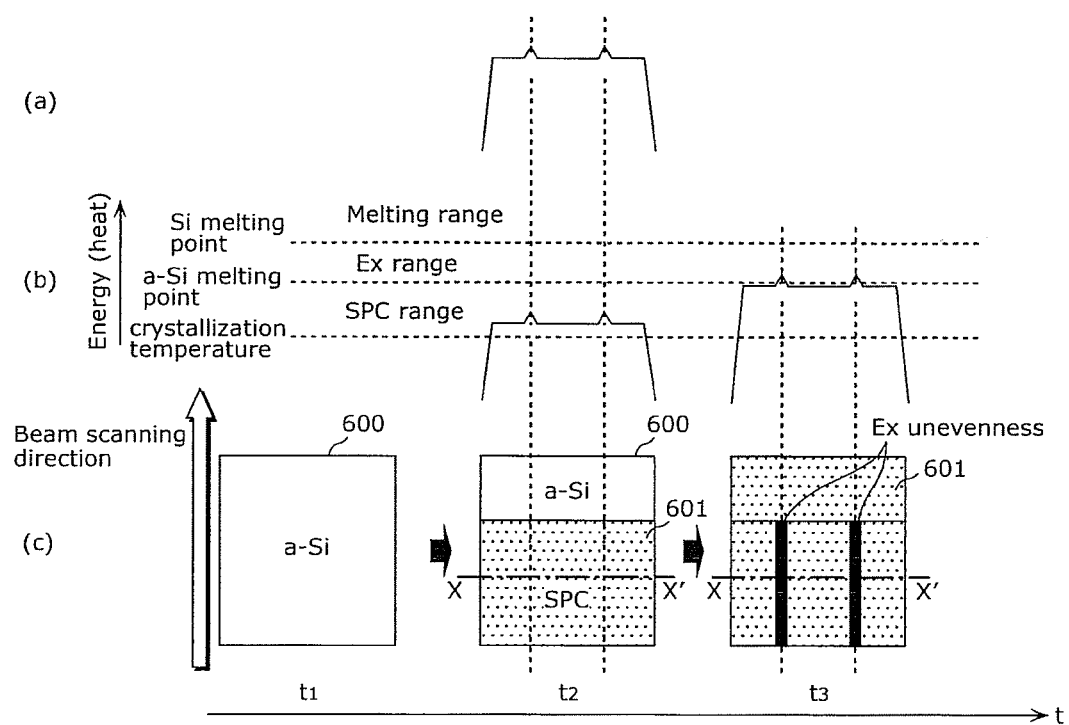
FIG. 4 is a schematic diagram for describing crystallization using the conventional CW laser beam.

First, at time t1, as shown in FIG. 4(*c*), a substrate on which an amorphous semiconductor film, specifically, an amorphous silicon (a-Si) film 600 is formed is prepared.

Next, at time t2, the amorphous silicon film 600 is irradiated with a long-axis flat-topped CW laser beam as shown in FIG. 4(*a*). Here, the long-axis flat-topped CW laser beam is continuously shot in a beam scan direction shown in FIG. 4(*c*). Then, a portion of the amorphous silicon film 600, which is irradiated with the long-axis flat-topped CW laser beam, represents, as shown in FIG. 4(*b*), a temperature distribution within the SPC range, and becomes a SPC crystalline semiconductor film 601. It should be noted that the flat-topped CW laser beam along the long axis shown in FIG. 4(*a*) causes fluctuation in light intensity at the flat-topped portion in the long axis. The state is represented by the projections in the flat-topped portion along the long axis in FIG. 4(*a*).

Next, at time t3, the scanning using the long-axis flat-topped CW laser beam, which is performed on the flat surface of the amorphous silicon film 600, is completed, that is, irradiation to the entire surface of the amorphous silicon film 600 is completed. In this case, the temperature of the amorphous silicon film 600, as shown in FIG. 4(*b*), further increases due to the latent heat generated in the crystallization but is almost within the SPC range, thus forming the SPC crystalline semiconductor film 601.

However, the figure also indicates an increase in temperature at the projections in the flat-topped portion along the long axis, that is, the portion at which the amorphous silicon film 600 is irradiated with a fluctuating part of the light intensity. A mechanism of crystallization differs between the case of crystallization within the SPC range and the case of crystallization beyond the SPC range and within an Ex range, and this accordingly causes difference in grain size after the crystallization. Thus, grain size unevenness (hereinafter, referred to as Ex unevenness) is caused in the portion crystallized beyond the SPC range and within the Ex range.

Thus, in the case of crystallizing an amorphous semiconductor film into a crystalline semiconductor film using the conventional long-axis flat-topped CW laser beam, there is a problem that a semiconductor film formed within the Ex range is formed in the SPC crystalline semiconductor film 601, which causes Ex unevenness. In other words, this not only causes loss in surface flatness of the crystalline semiconductor film but also causes in-plane variation in grain size in the crystalline semiconductor film. Such variation negatively influences characteristics of the thin-film transistor including this crystalline semiconductor film.

It should be noted that in the case of crystallizing the amorphous semiconductor film into a crystalline semiconductor film using the conventional long-axis flat-topped CW laser beam, as shown in FIG. 4(c), the SPC crystalline semiconductor film 601 is formed in a potion other the portion in which the Ex unevenness is generated, thus uniformly reducing grain size of the crystalline structure of the silicon within the SPC range.

Figure 5:
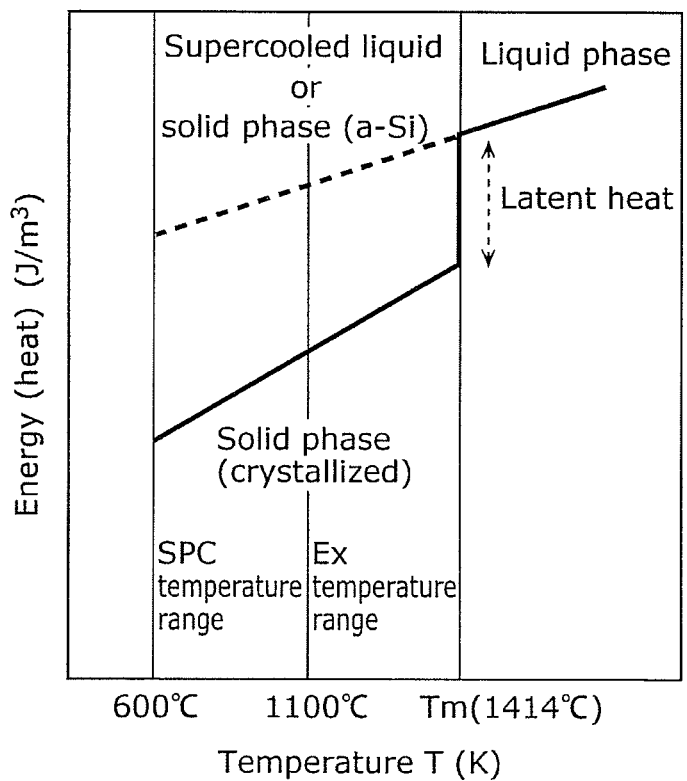
FIG. 5 is a diagram showing a relationship between temperature and energy for crystallizing silicon.

Here, the mechanism for crystallizing silicon is described with reference to FIG. 5. FIG. 5 is a diagram showing a relationship between temperature and energy for crystallizing silicon. It should be noted that in FIG. 5, the horizontal axis represents temperature, and the vertical axis represents energy (heat).

As shown in FIG. 5, silicon in the amorphous state is heated by, for example, irradiation of a laser beam or the like, and is assumed to fall within the SPC range, that is, the temperature range of 600° C. to 1100° C. This causes a solid-phase growth of silicon into microcrystals. It should be noted that the silicon crystallized within this SPC range becomes a SPC crystalline silicon having an average grain size of 25 nm to 35 nm.

Furthermore, it is assumed that: by heating the silicon of the SPC range, the temperature within the silicon is within the Ex range, which is a range above 1100° C. that is the temperature considered as the melting point that causes change in atomic network structure in the silicon in the amorphous state, and is also a range equal to or below 1414° C. that is the melting point of silicon. This slightly increases the grain size of silicon crystals from the size of crystals (crystalline silicon of SPC) obtained in solid-phase growth. A possible reason for this is that: the temperature of the silicon has increased to a level equal to or above the melting point of the amorphous silicon, to thereby melt the silicon partially and increase grain size. It should be noted that the silicon crystallized within this Ex range becomes a crystalline silicon of the Ex range having an average grain size of 40 nm to 60 nm.

Then, furthermore, it is assumed that the silicon of the Ex range is heated to have a temperature within the melting range, that is, the temperature range equal to or above 1414° C. that is the melting point of silicon. Thus, the crystals obtained within the Ex range (crystalline silicon of Ex) is provided with thermal energy as latent heat at the melting point of the silicon, and is solved (into a liquid phase). It should be noted that the silicon, which becomes crystallized through the melting range, becomes crystallized involving volume expansion after it is solved and reduced in volume, and is formed into a p-Si (polycrystalline silicon) having an average grain size of 50 nm or above.

Figure 6:
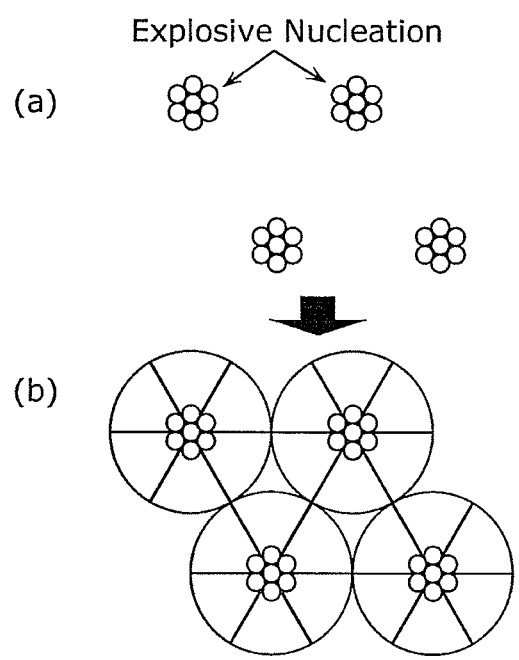
FIG. 6 is a diagram for describing a growth mechanism of an Ex crystalline structure.

Next, the mechanism for solving the silicon of the Ex range will be described with reference to FIG. 6. FIG. 6 is a diagram for describing a growth mechanism of the Ex crystalline structure.

In the silicon within the SPC range, a plurality of atoms stochastically gather, become a crystal nucleus when having a size over a critical grain size (up to 1 nm), and grow into crystals.

In contrast, since the silicon in the Ex range is heated to a temperature equal to or above the melting point of amorphous silicon, movement of atoms is promoted, which promotes, as shown in FIG. 6(a), crystal nucleation. Then, as shown in FIG. 6(b), a periphery of the nucleus after explosive nucleation is melted by latent heat, and then crystallized.

As described above, the mechanism of crystallization differs between the case of crystallization within the SPC range, the case of crystallization beyond the SPC range and within the Ex range, and the case of crystallization within the melting range, and the difference accordingly causes difference in grain size after the crystallization.

Figure 7:
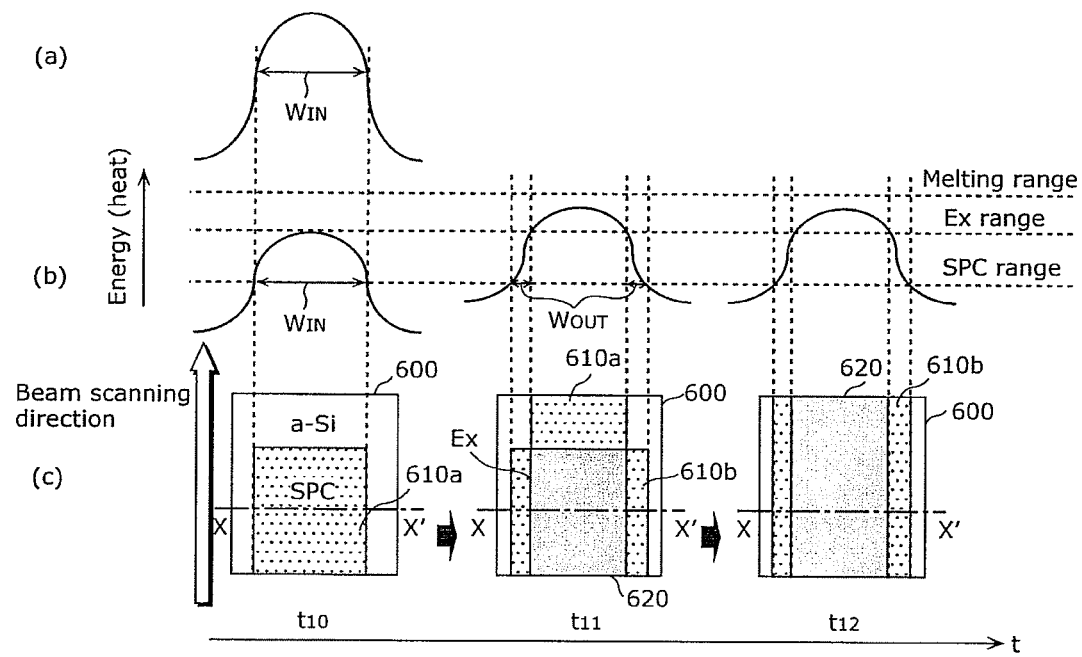
FIG. 7 is a schematic diagram for describing crystallization using the CW laser beam in the embodiment of the present invention.

Next, the following will describe, with reference to FIG. 7, a mechanism of silicon crystallization in the case of irradiating the amorphous semiconductor with the CW laser beam using the CW laser beam crystallization device 500 according to the present embodiment. FIG. 7 is a schematic diagram for describing crystallization using the CW laser beam according to the present embodiment, and FIG. 7(a) is a cross-sectional view of a beam profile in the long-axis direction of the CW laser beam according to the present embodiment. In addition, FIG. 7(b) is a diagram indicating a temperature distribution along a cross section (X-X' cross section in FIG. 7(c)) of the amorphous semiconductor film irradiated with a laser. In addition, FIG. 7(c) is a diagram schematically showing a surface state of the amorphous semiconductor film when irradiated with the laser beam. It should be noted that a vertical axis in FIG. 7(b) represents energy (heat), and a horizontal axis t in FIG. 7(c) represents time course.

First, a substrate is prepared on which an amorphous silicon (a-Si) film 600 which is an amorphous semiconductor film is formed, and at time t10, the amorphous silicon film 600 is irradiated with the CW laser beam (hereinafter, described as the "long-axis Gaussian CW laser beam") having a Gaussian long-axis beam profile as shown in FIG. 7(a).

Here, the long-axis Gaussian CW laser beam is sequentially shot in the beam scan direction shown in FIG. 7(c) with output density such that the temperature of the amorphous silicon film 600 irradiated with the laser beam is within the range of 600° C. to 1100° C. As a result of this irradiation, a portion (portion irradiated with a laser beam inner region), which is irradiated with an inner region (laser beam inner region) $W_{IN}$ having a constant width in the light intensity distribution of the long-axis Gaussian CW laser beam, indicates a temperature distribution of the SPC range as shown in FIG. 7(b), and is formed into a SPC crystalline semiconductor film 610. It should be noted that the long-axis Gaussian CW layer beam shown in FIG. 7(a) has no fluctuation in light intensity as seen in the long-axis flat-topped CW laser beam shown in FIG. 4(a).

Next, the amorphous silicon film 600 is continuously irradiated with the long-axis Gaussian CW laser beam, and at time t11, the laser irradiation using the long-axis Gaussian CW laser beam reaches the end of the amorphous silicon film 600. With this, the portion irradiated with the laser beam inner region after time t10 indicates the temperature distribution of the SPC range, and is formed into a SPC crystalline semiconductor film 610a.

At this time, as shown in FIG. 7(b) at time t11, the temperature of the SPC crystalline semiconductor film 610a in the portion irradiated with the laser beam inner region increases due to latent heat which is generated when the amorphous silicon film 600 becomes crystallized, and the SPC crystalline semiconductor film 610a becomes an Ex crystalline semiconductor film 620 indicating a temperature distribution of the Ex range. It should be noted that the Ex range, as described earlier, is a range over the temperature (1100° C.) that is considered as the melting point which varies depending on the atomic network structure in the amorphous silicon film 600, and is also a range equal to or below 1414° C. that is the melting point of silicon.

Furthermore, the portion (portion irradiated with a laser beam outer region), which is irradiated with an outer region (laser beam outer region) $W_{OUT}$ located outside the inner region having the constant width in the light intensity distribution of the long-axis Gaussian CW laser beam, that is, an outer adjacent region to the portion irradiated with the laser beam inner region as viewed from the bean scan direction, becomes a SPC crystalline semiconductor film 610*b* indicating the temperature distribution of the SPC range.

Subsequently, the temperature increase due to latent heat at the portion irradiated with the laser beam inner region proceeds into the scanning direction, and at time t12, the entire SPC crystalline semiconductor film 610*a* within the portion irradiated with the laser beam inner region becomes the Ex crystalline semiconductor film 620 which indicates the temperature distribution of the Ex range. At the same time, the portion irradiated with the laser beam outer region becomes the SPC crystalline semiconductor film 610*b* over time, and at time t12, the entire portion irradiated with the laser beam outer region becomes the SPC crystalline semiconductor film 610*b* which indicates the temperature distribution of the SPC range.

Thus, the light intensity distribution of the CW laser beam according to the present embodiment has a configuration such that: when irradiating the noncrystalline semiconductor film such that the temperature of the portion irradiated with the laser beam inner region is within the temperature range of 600° C. to 1100° C., the noncrystalline semiconductor film in the portion irradiated with the laser beam inner region becomes crystallized according to the temperature range of 1100° C. to 1414° C. due to latent heat generated in the crystallization, and formed into the Ex crystalline semiconductor film 620. Furthermore, the light intensity distribution of the CW laser beam according to the present embodiment is configured such that the noncrystalline semiconductor film in the portion irradiated with the laser beam outer region becomes crystallized into the SPC crystalline semiconductor film 610*b* according to the temperature range of 600° C. to 1100° C.

This allows forming, at the same time, the Ex crystalline silicon film within the Ex range corresponding to the temperature range of 1100° C. to 1414° C., and the SPC crystalline silicon film within the SPC range corresponding to the temperature range of 600° C. to 1100° C. As a result of this forming, the Ex crystalline silicon film, while keeping in-plane uniformity, has an average grain diameter of 40 nm to 60 nm. In addition, the average grain size of the SPC crystalline silicon film is 25 nm to 35 nm. It should be noted that the Ex crystalline silicon film thus crystallized, that is, the crystalline silicon film having the Ex crystalline structure, is slightly increased in grain size from the crystal obtained in solid-phase growth without losing uniformity, and without forming protrusion in the surface. In addition, no surface protrusion is formed in the SPC crystalline silicon film, either.

As described above, according to the present embodiment, it is possible to obtain a crystalline semiconductor film which has a crystalline structure with satisfactory in-plane uniformity without surface protrusion, and includes two portions having different grain sizes.

It should be noted that in the present embodiment, the noncrystalline semiconductor film has been described as being irradiated with the long-axis Gaussian CW laser beam, at time t10, with output density such that the temperature of the amorphous silicon film 600 irradiated with the long-axis Gaussian laser beam is within the range of 600° C. to 1100° C., but this is not the only case. The noncrystalline semiconductor film may also be irradiated with the output density such that the temperature of the irradiated amorphous silicon film 600 is within a range of 600° C. to 800° C., to produce the same advantageous effect.

In addition, in the present embodiment, it is preferable that the inner region $W_{IN}$ having a constant width in the light intensity distribution be a region having light intensity of 80% or above when the maximum light intensity in the light intensity distribution is 100%. On the other hand, it is preferable that the outer region $W_{OUT}$ outside the inner region $W_{IN}$ having the constant width in the light intensity distribution be a region having light intensity from 50% to below 80%. By thus setting the inner region $W_{IN}$ and the outer region $W_{OUT}$, it is possible to form, at the same time, the first crystalline semiconductor film including crystal grains having an average grain size of 40 nm to 60 nm, and the second crystalline semiconductor film including crystal grains having an average grain size of 25 nm to 35 nm. In addition, it is possible to form a semiconductor film which has satisfactory flatness without surface protrusion.

In addition, it is preferable that the laser irradiation be performed using the long-axis Gaussian CW laser beam for microsecond-order time such as 10 to 100 microseconds. Specifically, the noncrystalline semiconductor film is irradiated with the long-axis Gaussian CW laser beam for microsecond-order time such as 10 to 100 microseconds such that the temperature of the noncrystalline semiconductor film is within the range of 600° C. to 1100° C. (SPC range). With this, it is possible to form a crystalline semiconductor film having a crystalline structure with satisfactory in-plane uniformity.

Such laser irradiation for microsecond-order time is performed such that in the laser irradiation using the long-axis Gaussian CW laser beam so as to increase the temperature of the noncrystalline semiconductor film within the range from 600° C. to 1100° C. (SPC range), the temperature of the noncrystalline semiconductor film irradiated with the laser beam is within the range of 1100° C. to 1414° C. due to the latent heat that is generated when the noncrystalline semiconductor becomes crystallized. With this, since the noncrystalline semiconductor film irradiated with the laser is not crystallized beyond the temperature range up to 1414° C., but becomes crystallized within the temperature range of 1100° C. to 1414° C., thus allowing suppressing generation of surface protrusion so as to keep surface flatness. As a result, it is possible to improve characteristics of the thin-film transistor including the crystalline semiconductor film thus formed.

Furthermore, with the irradiation using the long-axis Gaussian CW laser for microsecond-order time instead of nanosecond-order time, it is possible to increase the irradiation time of the long-axis Gaussian CW laser beam. This allows securing sufficient time for the atomic structure to be rearranged from the amorphous state into crystals.

(Structure of the Thin-Film Transistor Array Device)

Next, a thin-film transistor array device according to an embodiment of the present invention will be described with reference to the drawings.

Figure 8:
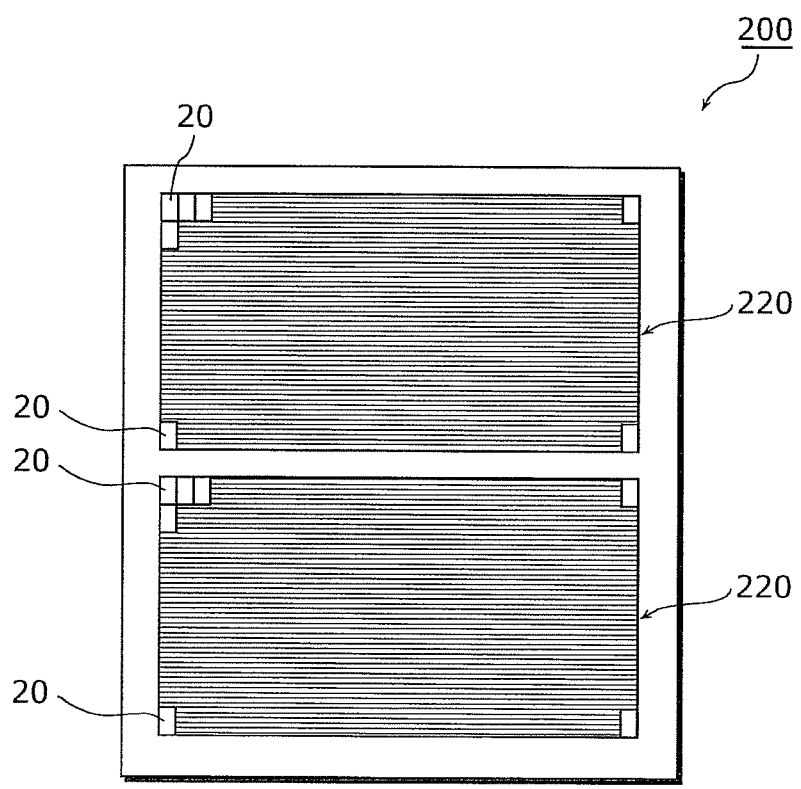
FIG. 8 is a thin-film transistor array substrate including a thin-film transistor array device according to an embodiment of the present invention.

FIG. 8 is a thin-film transistor array substrate (TFT array substrate) 200 including a thin-film transistor array device according to the embodiment of the present invention. In addition, FIG. 9 is a plan view showing a pixel configuration on the TFT array substrate in FIG. 8.

As shown in FIG. 8, the TFT array substrate 200 is an active matrix substrate, and includes a display unit 220 in which a plurality of pixels 20 are arranged in a matrix. It should be noted that FIG. 8 shows the TFT array substrate 200 on which two display units 220 are formed, and it is possible to obtain two TFT array substrates by cutting off this TFT array substrate 200. In addition, in FIG. 8, the pixels 20 are illustrated only in part of the four corners of the display unit 220, but in practice, the pixels 20 are arranged in a matrix in the display unit 220.

Figure 9:
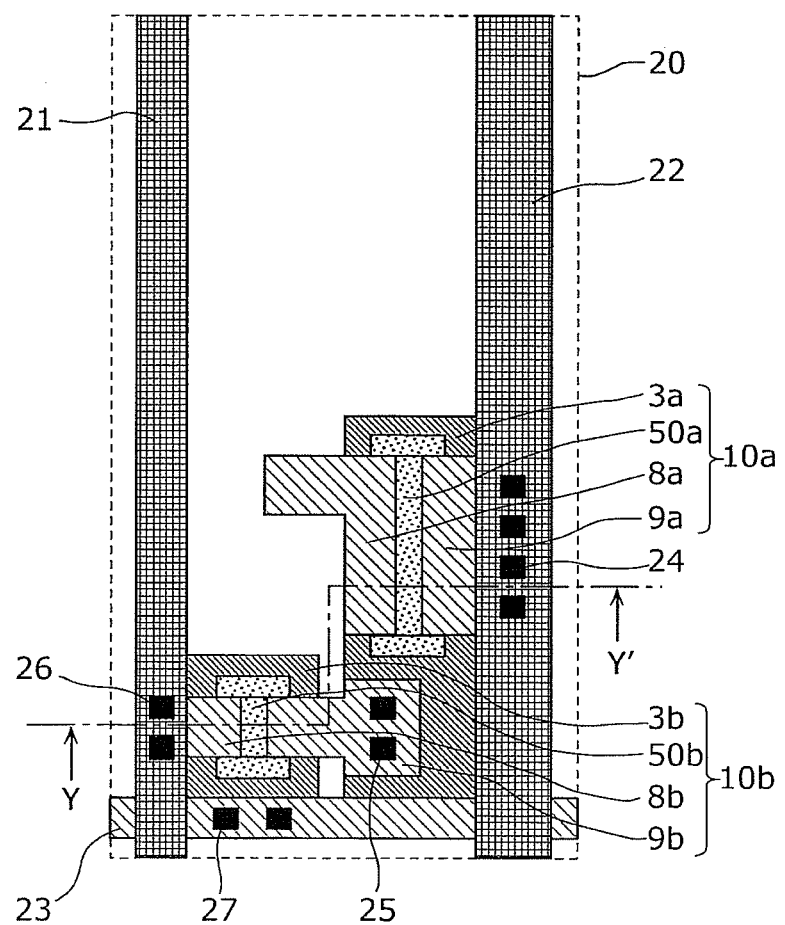
FIG. 9 is a plan view of a pixel structure on the thin-film transistor array substrate shown in FIG. 8.

As shown in FIG. 9, the pixels 20 are partitioned by a source line 21, a power supply line 22, and a gate line 23, and one pixel 20 (unit pixel) includes a driving TFT 10a that is the first thin-film transistor and a switching TFT 10b that is the second thin-film transistor.

The driving TFT (the first thin-film transistor) 10a is a driving thin-film transistor for driving an organic EL element (not shown) and is includes: a first gate electrode 3a; a first channel portion 50a formed into an island state on the first gate electrode 3a; and a first source electrode 8a and a first drain electrode 9a that are formed on the first channel portion 50a.

The switching TFT (the second thin-film transistor) 10b is a switching (selecting) thin-film transistor for selecting a supply of an image signal to the pixel and includes: a second gate electrode 3b; a second channel portion 50b formed into an island state on the second gate electrode 3b; and a second source electrode 8b and a second drain electrode 9b that are formed on the second channel portion 50b.

In addition, as shown in FIG. 9, in the driving TFT 10a, the first drain electrode 9a is electrically connected to the power supply line 22 via a contact 24, and the first gate electrode 3b is electrically connected to the second drain electrode 9b in the switching TFT 10b via a contact 25. It should be noted that, though not shown, the first source electrode 8a in the driving TFT 10a is electrically connected to a lower electrode in the organic EL element.

In addition, in the switching TFT 10b, the second source electrode 8b is electrically connected to the source line 21 via a contact 26, and the second gate electrode 3b is electrically connected to the gate line 23 via a contact 27. The switching TFT 10b and the second drain electrode 9b, as described earlier, are electrically connected to the first gate electrode 3a in the driving TFT 10a.

It should be noted that the first gate electrode 3a in the driving TFT 10a and the power supply line 22 are configured to overlap with each other in a direction perpendicular to the substrate via an insulating film, and form a condenser 29 (not shown).

In the thin-film transistor array device according to the embodiment of the present invention, the second drain electrode 9b and the first gate electrode 3b are electrically connected to each other. This allows connecting the driving TFT 10a and the switching TFT 10b with a shortest wiring length. As a result, it is possible to minimize electrical resistance between the driving TFT 10a and the switching TFT 10b. Thus, it is possible to realize a thin-film transistor array device which operates at high speed with smaller power loss. It should be noted that in the configuration, the second source electrode 8b, instead of the second drain electrode 9b, may be electrically connected to the first gate electrode 3a.

Figure 10:
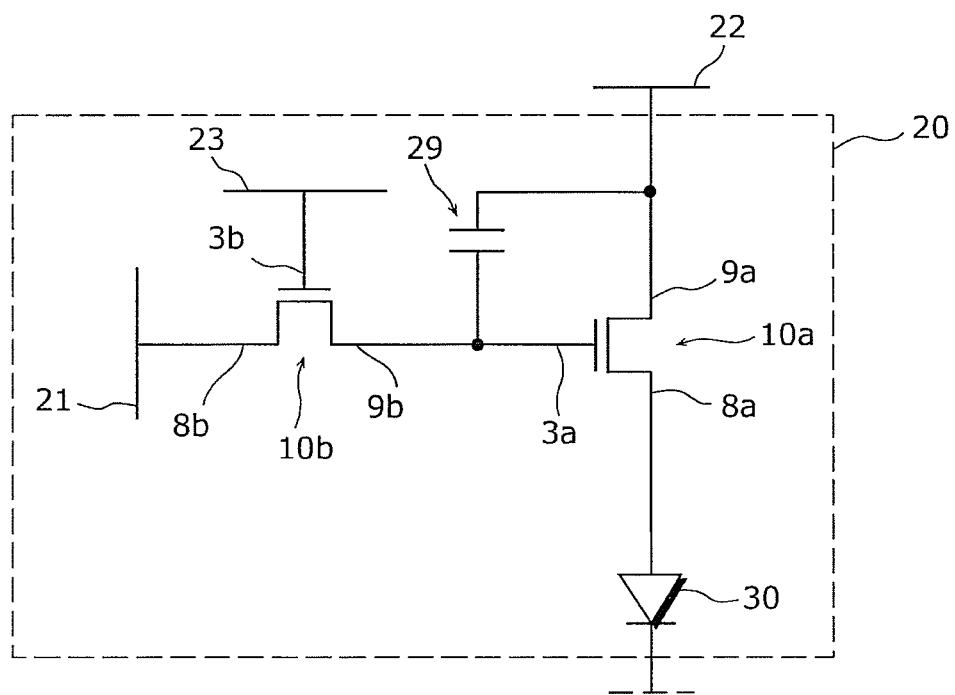
FIG. 10 is a circuit configuration diagram of a pixel of a thin-film transistor array device according to an embodiment of the present invention.

Next, a configuration of an equivalent circuit of the pixel thus configured will be described with reference to FIG. 10. FIG. 10 is a circuit configuration diagram of a pixel of the thin-film transistor array device according to an embodiment of the present invention.

As shown in FIG. 10, the pixel 20 includes: the driving TFT 10a, the switching TFT 10b, the condenser 29, and the organic EL device 30. As described above, the first drain electrode 9a in the driving TFT 10a is connected to the power supply line 22, and the first source electrode 8a is connected to an anode of an organic EL element 30. In addition, the second source electrode 8b in the switching TFT 10b is connected to the source line 21, and the second gate electrode 3b is connected to the gate line 23, and the second drain electrode 9b is connected to the condenser 29 and the first gate electrode 3a in the driving TFT 10a.

In this configuration, when a gate signal is input into the gate line 23 to turn the switching TFT 10b into an ON state, a signal voltage supplied via the source line 21 is written into the condenser 29. Then, a held voltage, which is written into the condenser 29, is held through one frame period. This held voltage causes analog change in conductance of the driving TFT 10a, so that drive current corresponding to luminescence gradation flows from anode to cathode of the organic EL element 30. With this, the organic EC element 30 becomes luminescent, so that an image is displayed.

Figure 11:
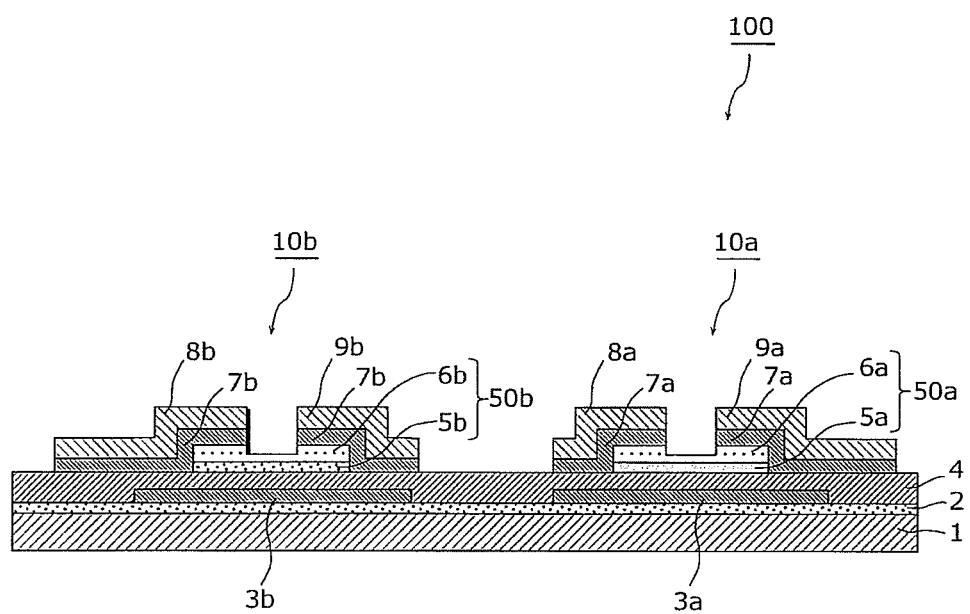
FIG. 11 is a cross-sectional view of a configuration of a thin-film transistor array device according to an embodiment of the present invention.

Next, a thin-film transistor array device according to an embodiment of the present invention will be described with reference to FIG. 11. FIG. 11 is a cross-sectional view of a configuration of a thin-film transistor array device according to an embodiment of the present invention. Note that FIG. 11 is a cross-sectional view along Y-Y' line in FIG. 9.

As shown in FIG. 11, a thin-film transistor array device 100 according to an embodiment of the present invention includes the driving TFT 10a and the switching TFT 10b.

The driving TFT 10a is a bottom-gate thin-film transistor device, and includes: an undercoat layer 2, a first gate electrode 3a, a gate insulating film 4, a first crystalline semiconductor film 5a, a first noncrystalline semiconductor film 6a, a pair of first contact layers 7a, a first source electrode 8a, and a first drain electrode 9a, which are serially formed on a substrate 1. It should be noted that the first channel portion 50a in the driving TFT 10a includes the first crystalline semiconductor film 5a and the first noncrystalline semiconductor film 6a.

In addition, the switching TFT 10b is a bottom-gate thin-film transistor device, and includes: the undercoat layer 2, a second gate electrode 3b, the gate insulating film 4, a second crystalline semiconductor film 5b, a second noncrystalline semiconductor film 6b, a pair of second contact layers 7b, a second source electrode 8b, and a second drain electrode 9b, which are serially formed on the substrate 1. It should be noted that the second channel portion 50b in the switching TFT 10b includes the second crystalline semiconductor film 5b and the second noncrystalline semiconductor film 6b.

Hereinafter, a configuration of each of the driving TFT 10a and the switching TFT 10b will be described in further detail.

The substrate 1 is common to the driving TFT 10a and the switching TFT 10b, and is made of, for example, a glass material such as silica glass and the like.

The undercoat layer 2 is formed on the substrate 1 to prevent an impurity included in the substrate 1 from invading the semiconductor film that is an upper layer, and is formed as, for example, a silicon nitride film such as a silicon nitride film (SiN) and the like.

The first gate electrode 3a and the second gate electrode 3b are formed on the undercoat layer 2, and is made of, for example, molybdenum tungsten (MoW) and the like.

The gate insulating film 4 is common to the driving TFT 10a and the switching TFT 10b, and is formed to cover the first gate electrode 3a and the second gate electrode 3b, and is made of, for example, silicon dioxide ($SiO_2$) or silicon nitride (SiN) and the like.

The first crystalline semiconductor film 5a in the driving TFT 10a is formed on the gate insulating film 4, and is formed by crystallizing a noncrystalline semiconductor film. An average grain size (first average grain size) of the first crystalline semiconductor film 5a is 40 nm to 60 nm. In the present embodiment, the first crystalline semiconductor film 5a has a microcrystalline structure called microcrystals, which is formed by crystallizing an amorphous silicon film. It should be noted that the first crystalline semiconductor film 5a may be mixed crystal having a noncrystalline structure and a crystalline structure.

The second crystalline semiconductor film 5b in the switching TFT 10b is also formed on the gate insulating film 4, and is formed by crystallizing a noncrystalline semiconductor film. However, the average grain size (second average grain size) of the second crystalline semiconductor film 5b is smaller than the average grain size of the first crystalline semiconductor film 5a, and is 25 nm to 35 nm. In the present embodiment, the second crystalline semiconductor film 5b has a microcrystalline structure called microcrystals, which is formed by crystallizing an amorphous silicon. It should be noted that the second crystalline semiconductor film 5b may also be mixed crystal having a noncrystalline structure and a crystalline structure.

It should be noted that in the present embodiment, as described later, the first crystalline semiconductor film 5a and the second crystalline semiconductor film 5b are formed at the same time by laser irradiation in the same process.

The first noncrystalline semiconductor film 6a in the driving TFT 10a and the second noncrystalline semiconductor film 6b in the switching TFT 10b are formed on the first crystalline semiconductor film 5a and the second crystalline semiconductor film 5b, respectively, and each of the first and second noncrystalline semiconductor films 6a and 6b is formed as an amorphous silicon film and the like.

The pair of first contact layers 7a and the pair of second contact layers 7b are formed on the first noncrystalline semiconductor film 6a and the second noncrystalline semiconductor film 6b, respectively, and each of the pairs is formed as amorphous semiconductor films including an impurity in high concentration. In the present embodiment, the first contact layers 7a and the second contact layers 7b are n-type semiconductor layers formed by doping phosphorous (P) in the amorphous silicon film as an impurity, and include a high concentration of impurity of $1\times10^{19}$ (atm/cm$^3$) or above.

In the driving TFT 10a, the first source electrode 8a and the first drain electrode 9a are formed on the first contact layers 7a. In addition, in the switching TFT 10b, the second source electrode 8b and the second drain electrode 9b are formed on the second contact layers 7b. Each of the first source electrode 8a, the first drain electrode 9a, the second source electrode 8b, and the second drain electrode 9b is a single-layer structure or multilayer structure that is made of a conductive material, an alloy, or the like, and is made of, for example, aluminum (Al), molybdenum (Mo), tungsten (W), copper (Cu), titanium (Ti), and chromium (Cr).

As described above, the thin-film transistor array device 100 according to an embodiment of the present invention includes the first crystalline semiconductor film 5a having a crystalline structure with satisfactory in-plane uniformity without surface protrusion, and including crystal grains having a relatively large average grain size. In addition, the thin-film transistor array device 100 according to an embodiment of the present invention includes the second crystalline semiconductor film 5b having a crystalline structure with satisfactory in-plane uniformity without surface protrusion, and including crystal grains having a relatively small average grain size. With this, it is possible to form the driving TFT 10a including the first crystalline semiconductor film 5a as the channel layer and the switching TFT 10b including the second crystalline semiconductor film 5b as the channel layer in the TFT. Accordingly, for the driving TFT 10a, it is possible to increase ON current through the first crystalline semiconductor film 5a having larger grains. In addition, for the switching TFT 10b, it is possible to increase ON current as compared to a TFT including a semiconductor film having an amorphous structure as the channel layer, and also to suppress OFF current as compared to a TFT including a semiconductor film having a large grain size as the channel layer.

It should be noted that in the present embodiment, the first crystalline semiconductor film 5a and the second crystalline semiconductor film 5b are spaced apart from each other. This prevents carriers of electrons or holes from flowing into the first crystalline semiconductor film 5a and the second crystalline semiconductor film 5b. As a result, it is possible to operate, without mutual interference, the driving TFT 10a including the first crystalline semiconductor film 5a as the channel layer and the switching TFT 10b including the second crystalline semiconductor film 5b as the channel layer.

(Configuration of the Organic EL Display Device)

Figure 12:
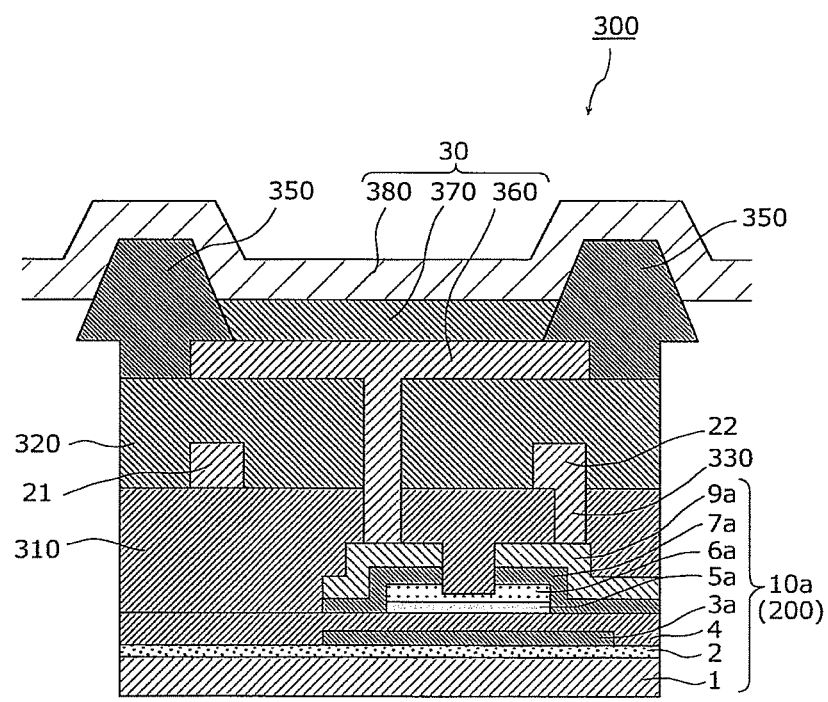
FIG. 12 is a cross-sectional view, in one pixel, of an organic EL display device according to an embodiment of the present invention.

Next, an organic EL display device 300 according to an embodiment of the present invention will be described with reference to FIG. 12. FIG. 12 is a cross-sectional view, in one pixel, of an organic EL display device according to an embodiment of the present invention.

The organic EL display device 300 according to an embodiment of the present invention includes the thin-film transistor array device 100 including the driving TFT 10a and the switching TFT 10b as described above, and the thin-film transistor array device 100 is provided in each of the plurality of pixels 20 in the TFT array substrate 200 as described above and shown in FIG. 8.

As shown in FIG. 12, the organic EL display device 300 according to the present embodiment includes: on the TFT array substrate 200 on which the driving TFT 10a and the switching TFT 10b (not shown) are formed, a first interlayer insulating film 310, a second interlayer insulating film 320, a first contact portion 330, a second contact portion 340, a bank 350, a lower electrode 360, an organic EL layer 370, and an upper electrode 380. It should be noted that FIG. 12 shows the driving TFT 10a, but does not show the switching TFT 10b.

As shown in FIG. 12, the first interlayer insulating film 310 is formed to cover the driving TFT 10a and the switching TFT 10b. On the first interlayer insulating film 310, the source line 21 and the power supply line 22 are formed, and the power supply line 22 and the first drain electrode 9a in the driving TFT 10a are electrically connected to each other via the first contact portion 330 which penetrates the first interlayer insulating film 310. In addition, the second interlayer insulating film 320 is formed to cover the source line 21 and the power supply line 22.

On the second interlayer insulating film 320, the bank 350 is formed in a boundary portion between adjacent pixels. Accordingly, a plurality of banks 350 are formed on the TFT array substrate 200, and an opening 351 is formed with adjacent banks 350. In the opening 351 in the bank 350, the organic EL device 30 including the lower electrode 360, the organic EL layer 370, and the upper electrode 380 is formed.

The lower electrode 360 is an anode provided for each pixel, on the second interlayer insulating film 320. The lower electrode 360 and the first source electrode 8a in the driving TFT 10a are electrically connected to each other via the second contact portion 340 which penetrates the first interlayer insulating film 310 and the second interlayer insulating film 320.

The organic EL layer (organic luminescent layer) 370 is formed on a per-color (subpixel column) basis or on a per-subpixel basis, and made of a predetermined organic luminescent material.

The upper electrode 380 is a cathode provided on the organic EL layer 370 and across a plurality of pixels, and is formed as a transparent electrode such as ITO.

As described above, in the organic EL display device 300 according to an embodiment of the present invention, the first crystalline semiconductor film 5a in the driving TFT 10a has an average grain size of 40 nm to 60 nm, which makes it possible to increase the current flowing in the first channel portion 50a of the driving TFT 10a. As a result, it is possible to increase an amount of current for luminescence of the pixels 20, thus allowing increase in luminescence brightness of the organic EL display device 300.

In addition, since the average grain size of the second crystalline semiconductor film 5b in the switching TFT 10b is 25 nm to 35 nm, it is possible to configure a TFT which operates faster than a switching TFT including a semiconductor film having an amorphous structure as the channel layer and suppressing OFF current as compared to a TFT including a semiconductor film having a large grain size as the channel layer. As a result, it is possible to realize an organic EL display device having an advantage in motion picture characteristics. Thus, it is possible to realize an organic EL display device that achieves high-level luminescence brightness and high-speed display.

(Method of Manufacturing a Thin-Film Transistor Array Device)

Next, a thin-film transistor array device 100 according to an embodiment of the present invention will be described with reference to the drawings.

Figure 13A:
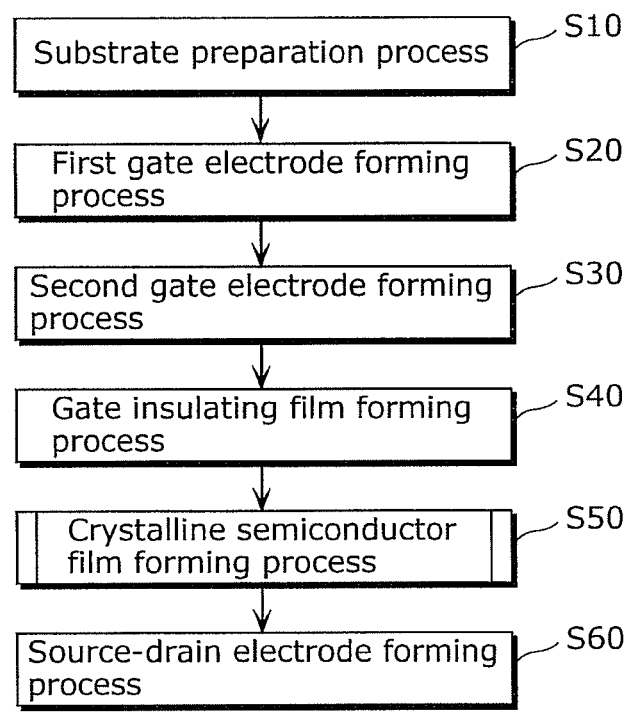
FIG. 13A is a flowchart of a method of manufacturing a thin-film transistor array device according to an embodiment of the present invention.
Figure 13B:
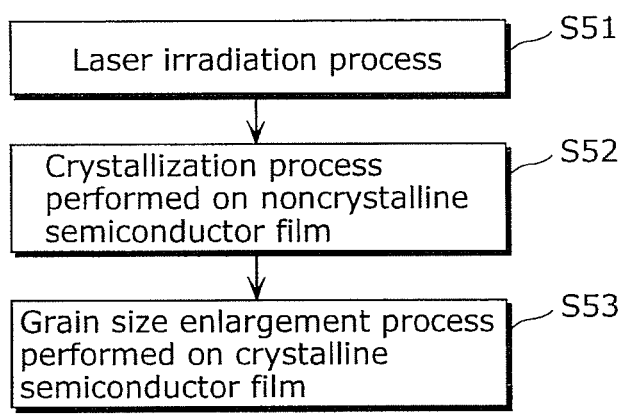
FIG. 13B is a flowchart of a crystalline semiconductor film forming process in the method of manufacturing the thin-film transistor array device according to an embodiment of the present invention.

FIG. 13A is a flowchart of a method of manufacturing a thin-film transistor array device according to an embodiment of the present invention. In addition, FIG. 13B is a flowchart of a crystalline semiconductor film forming process in the method of manufacturing the thin-film transistor array device according to an embodiment of the present invention, As shown in FIG. 13A, the method of manufacturing the thin-film transistor array device 100 according to an embodiment of the present invention includes, in the following order: a substrate preparation process (S10) that is a first process; a first gate electrode forming process (S20) that is a second process; a second gate electrode forming process (S30) that is a third process; a gate insulating film forming process (S40) that is a fourth process; a crystalline semiconductor film forming process (S50) that is a fifth process; and a source-drain electrode forming process (S60) that is a sixth process. Furthermore, as shown in FIG. 13B, the crystalline semiconductor film forming process (S50) that is the fifth process includes: Process 5-1 that is a laser irradiation process (S51) performed on a noncrystalline semiconductor film; Process 5-2 that is a crystallization process (S52) performed on the noncrystalline semiconductor film; and Process 5-3 that is a grain size enlargement process (S53) performed on the crystalline semiconductor film.

Next, a specific method of manufacturing the thin-film transistor array device 100 according to an embodiment of the present invention will be described with reference to FIGS. 14A to 14M. FIGS. 14A to 14M are sets of a plan view and a cross-sectional view, schematically showing respective processes in the method of manufacturing the thin-film transistor array device according to an embodiment of the present invention. It should be noted that, in each set of figures, a plan view is shown on the left, and a cross-sectional view of the plan view cut along Y-Y' line is shown on the right.

Figure 14A:
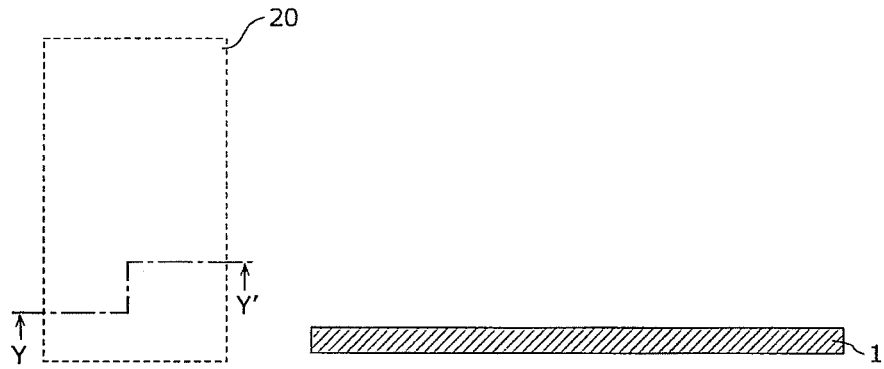
FIG. 14A is a plan view and a cross-sectional view schematically showing a substrate preparation process in the method of manufacturing a thin-film transistor array device according to an embodiment of the present invention.
Figure 14B:
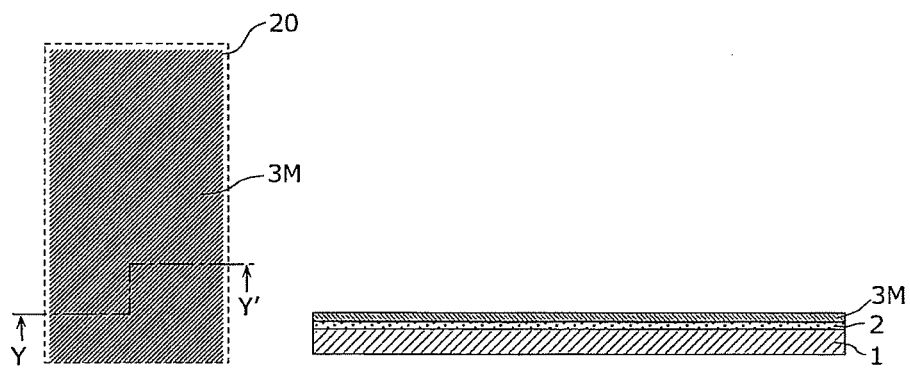
FIG. 14B is a plan view and a cross-sectional view schematically showing a gate metal film forming process in the method of manufacturing the thin-film transistor array device according to an embodiment of the present invention.

First, as shown in FIG. 14A, the substrate 1 made of glass material such as silica glass is prepared (S10). Subsequently, on the substrate 1, the undercoat layer 2 including an insulating film such as silicon nitride film is formed by plasma chemical vapor deposition (CVD) or the like.

Next, after cleansing the undercoat layer 2 with pure water or the like, a gate metal film 3M having a film thickness of approximately 50 nm is formed on the under coat layer 2. In the present embodiment, the gate metal film 3M including molybdenum tungsten (MoW) is formed by sputtering.

Figure 14C:
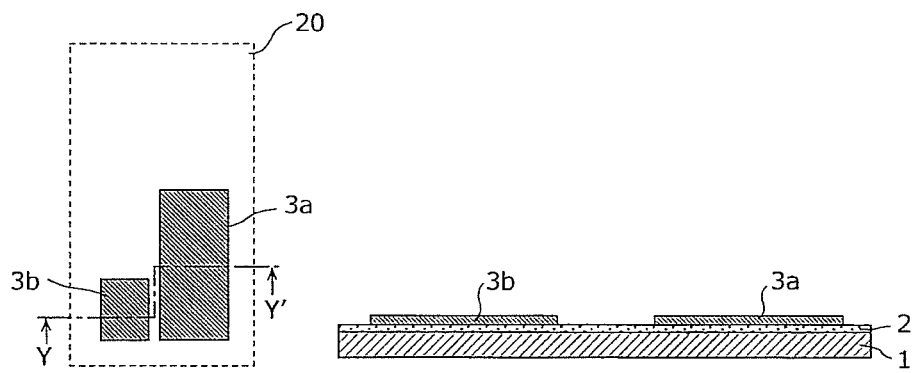
FIG. 14C is a plan view and a cross-sectional view schematically showing a gate metal film forming process in the method of manufacturing the thin-film transistor array device according to an embodiment of the present invention.

Next, as shown in FIG. 14C, each of the first gate electrode 3a and the second gate electrode 3b is formed into a predetermined shape by patterning the gate metal film 3M through photolithography and wet etching (S20, S30).

Figure 14D:
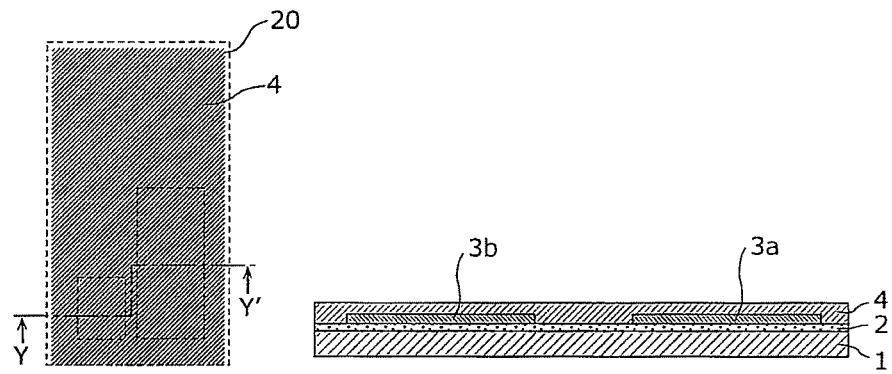
FIG. 14D is a plan view and a cross-sectional view schematically showing a gate insulating film forming process in the method of manufacturing the thin-film transistor array device according to an embodiment of the present invention.

Next, as shown in FIG. 14D, the gate insulating film 4 including silicon dioxide and having a film thickness of approximately 100 nm is formed on the first gate electrode 3a and the second gate electrode 3b, to cover these first and second gate electrodes 3a and 3b (S40). It should be noted that the gate insulating film 4 can be formed by plasma CVD or the like.

Figure 14E:
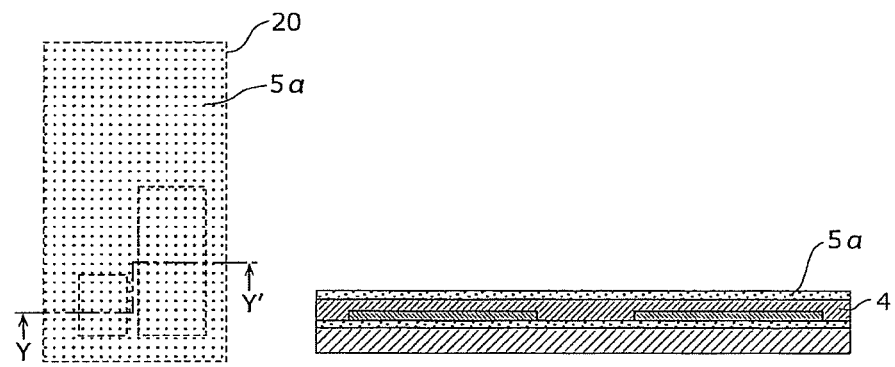
FIG. 14E is a plan view and a cross-sectional view schematically showing a noncrystalline semiconductor film forming process in the method of manufacturing the thin-film transistor array device according to an embodiment of the present invention.

Next, as shown in FIG. 14E, a noncrystalline semiconductor film 5a formed as an amorphous silicon film and having a thickness of approximately 50 nm is formed on the gate insulating film 4. It should be noted that it is also possible to form the noncrystalline semiconductor film 5a by plasma CVD or the like.

Subsequently, dehydrogenation processing is performed as a preliminary preparation for irradiating the noncrystalline semiconductor film 5a with the long-axis Gaussian CW laser beam. For a specific example, annealing is performed at 400° C. to 500° C. for 30 minutes. This annealing is performed because: the noncrystalline semiconductor film 5a formed as an amorphous silicon film normally contains 5% to 15% hydrogen as SiH, and when crystallizing the noncrystalline semiconductor film 5a that keeps such hydrogen content, not only does the hydrogen block the bonds of silicon to inhibit crystallization but also increases the possibility of a phenomenon like bumping.

Figure 14F:
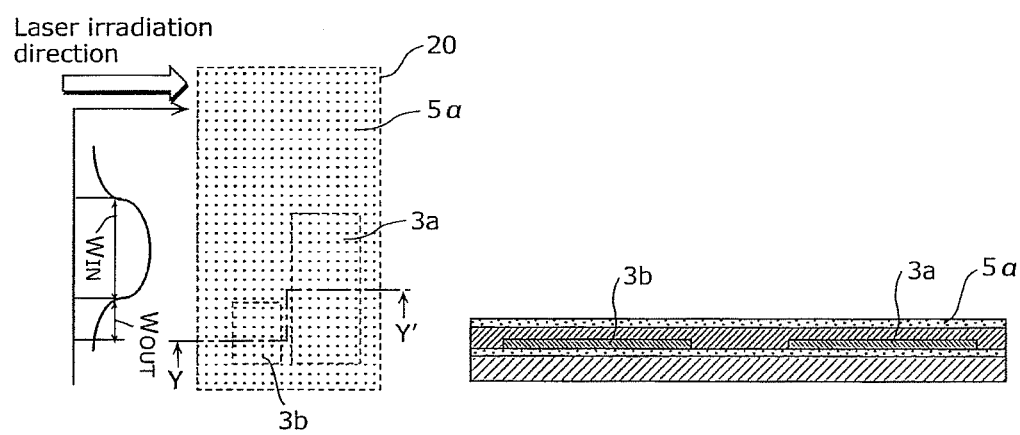
FIG. 14F is a plan view and a cross-sectional view schematically showing a crystalline semiconductor film forming process (laser irradiation process) in the method of manufacturing the thin-film transistor array device according to an embodiment of the present invention.

Next, as shown in FIG. 14F, the noncrystalline semiconductor film 5a is crystallized using the CW laser beam crystallization device shown in FIG. 1, by irradiating the noncrystalline semiconductor film 5a with the long-axis Gaussian CW laser beam having a light intensity distribution that is shaped as shown in FIG. 2 (S50).

Specifically, the noncrystalline semiconductor film 5a is irradiated with the long-axis Gaussian CW laser beam such that the temperature of the noncrystalline semiconductor film 5a is within the range of 600° C. to 1100° C. (SPC range) (S51). It should be noted that the long-axis Gaussian CW laser beam is shot for microsecond-order time.

In this processing, according to the present embodiment, the noncrystalline semiconductor film 5a located above the first gate electrode 3a is irradiated with the inner region (laser beam inner region) $W_{IN}$ having a constant width in the light intensity distribution of the long-axis Gaussian CW laser beam. In addition, at the same time, the noncrystalline semiconductor film 5a located above the second gate electrode 3b is irradiated with the outer region (laser beam outer region) $W_{OUT}$ located outside the inner region having the constant width in the light intensity distribution of the long-axis Gaussian CW laser beam.

Figure 14G:
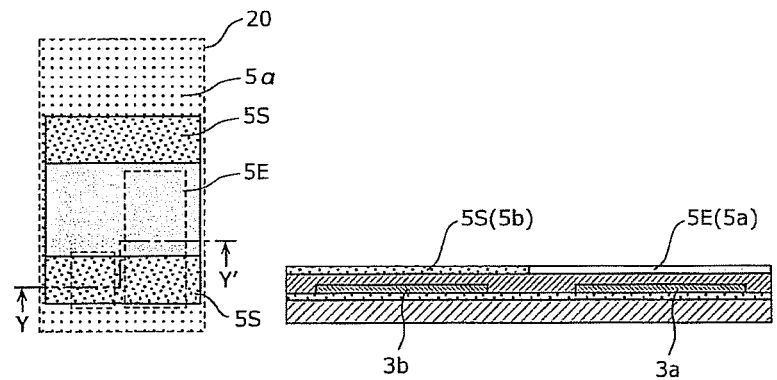
FIG. 14G is a plan view and a cross-sectional view schematically showing a crystalline semiconductor film forming process (crystallization process and grain size enlargement process) in the method of manufacturing the thin-film transistor array device according to an embodiment of the present invention.

With this, as shown in FIG. 14G, as with the case described earlier in FIG. 7, the portion at which the noncrystalline semiconductor film 5a is irradiated with the laser beam inner region $W_{IN}$ becomes a SPC crystalline semiconductor film having a crystal structure (crystal grains) that becomes crystallized by solid-phase growth within the range of 600° C. to 1100° C. (SPC range) (S52), and after a period of time, the temperature of the SPC crystalline semiconductor film further increases to a level within the temperature range of 1100° C. to 1414° C. (Ex range) due to latent heat generated in the crystallization, thus increasing grain size and forming the SPC crystalline semiconductor film into an Ex crystalline semiconductor film 5E. The Ex crystalline semiconductor film 5E becomes the first crystalline semiconductor film 5a including crystal grains having an average grain size of 40 nm to 60 nm (S53).

In addition, the portion at which the noncrystalline semiconductor film 5a is irradiated with the laser beam outer region $W_{OUT}$ becomes a SPC crystalline semiconductor film 5S having a crystal structure (crystal grains) that becomes crystallized within the temperature range of 600° C. to 1100° C. (SPC range). The SPC crystalline semiconductor film 5S becomes the second crystalline semiconductor film 5b including crystal grains having an average grain size of 25 nm to 35 nm.

Subsequently, hydrogen plasma treatment using hydrogen plasma is performed. In the hydrogen plasma treatment, hydrogen termination processing is performed on the noncrystalline semiconductor film 5a irradiated with the long-axis Gaussian CW laser beam; that is, the hydrogen termination processing is performed on the Ex crystalline semiconductor film 5E (first crystalline semiconductor film 5a), the SPC crystalline semiconductor film 5S (second crystalline semiconductor film 5b), and the noncrystalline semiconductor film 5a unirradiated with the laser beam.

Figure 14H:
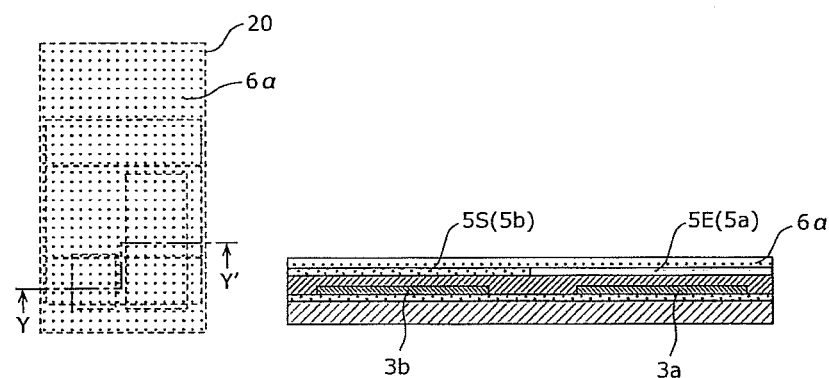
FIG. 14H is a plan view and a cross-sectional view schematically showing a noncrystalline semiconductor film forming process in the method of manufacturing the thin-film transistor array device according to an embodiment of the present invention.

Next, as shown in FIG. 14H, the noncrystalline semiconductor film 6a having a film thickness of approximately 100 nm is formed. Specifically, the noncrystalline semiconductor film 6a is formed as an amorphous silicon film by the plasma CVD method, on the Ex crystalline semiconductor film 5E (first crystalline semiconductor film 5a), the SPC crystalline semiconductor film 5S (second crystalline semiconductor film 5b), and the noncrystalline semiconductor film 5a unirradiated with a laser.

Figure 14I:
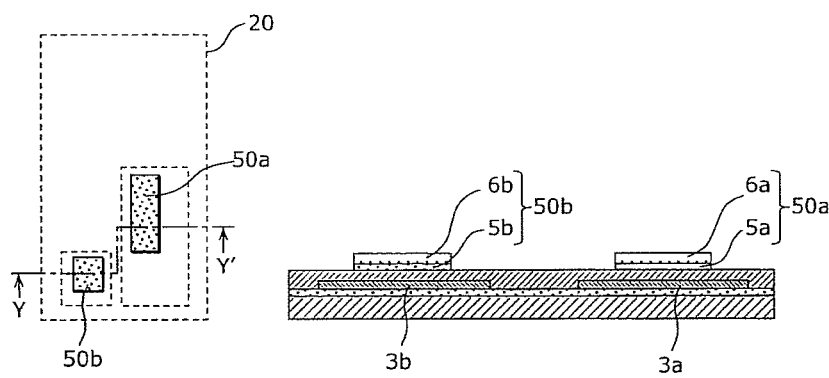
FIG. 14I is a plan view and a cross-sectional view schematically showing a channel portion island forming process in the method of manufacturing the thin-film array device according to an embodiment of the present invention.

Next, as shown in FIG. 14I, the first crystalline semiconductor film 5a and the first noncrystalline semiconductor film 6a are formed into an island state by selectively patterning, by photolithography and wet etching, the Ex crystalline semiconductor film 5E and the noncrystalline semiconductor film 6a that are stacked. In addition, at the same time, the second crystalline semiconductor film 5b and the second noncrystalline semiconductor film 6b are also formed into an island state by selectively patterning the SPC crystalline semiconductor film 5S and the noncrystalline semiconductor film 6a that are stacked. With this, it is possible to form: the first channel portion 50a in which the first crystalline semiconductor film 5a and the first noncrystalline semiconductor film 6a are stacked; and the second channel portion 50b in which the second crystalline semiconductor film 5b and the second noncrystalline semiconductor film 6b are stacked.

Figure 14J:
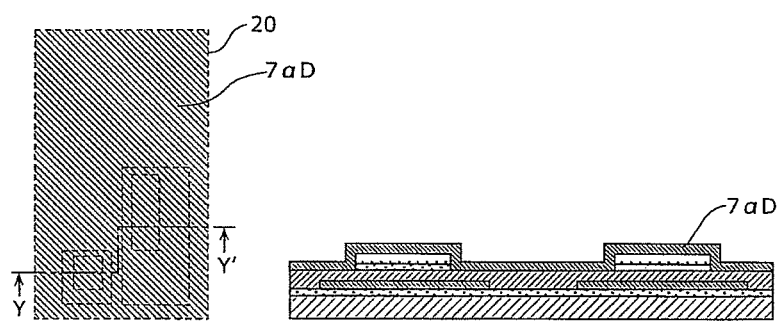
FIG. 14J is a plan view and a cross-sectional view schematically showing an impurity-doped noncrystalline semiconductor film forming process in the method of manufacturing the thin-film transistor array device according to an embodiment of the present invention.

Next, as shown in FIG. 14J, an impurity-doped amorphous semiconductor film 7aD that is to be the first contact layers 7a and the second contact layers 7b is formed by: forming an amorphous semiconductor film as an amorphous silicon film by the plasma CVD or the like, and doping an impurity in the amorphous semiconductor film. For the impurity, for example, a quinquevalent element such as phosphorous can be used. In addition, doping is performed such that the impurity concentration is at a high level.

Figure 14K:
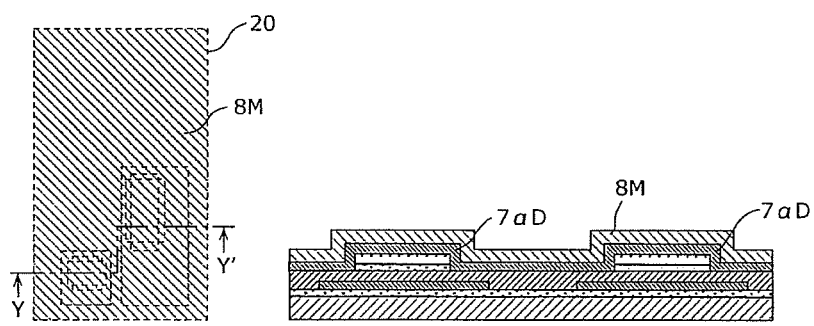
FIG. 14K is a plan view and a cross-sectional view schematically showing a source-drain electrode forming process in the method of manufacturing the thin-film transistor array device according to an embodiment of the present invention.

Next, as shown in FIG. 14K, a source-drain metal film 8M is formed on the impurity-doped amorphous semiconductor film 7a D. The material for the source-drain metal film 8M is the material used for forming the first source electrode 8a, the first drain electrode 9a, the second source electrode 8b, and the second drain electrode 9b. According to the present embodiment, the source-drain metal film 8M having a trilayer structure of MoW/Al/MoW is formed by the sputtering method.

Figure 14L:
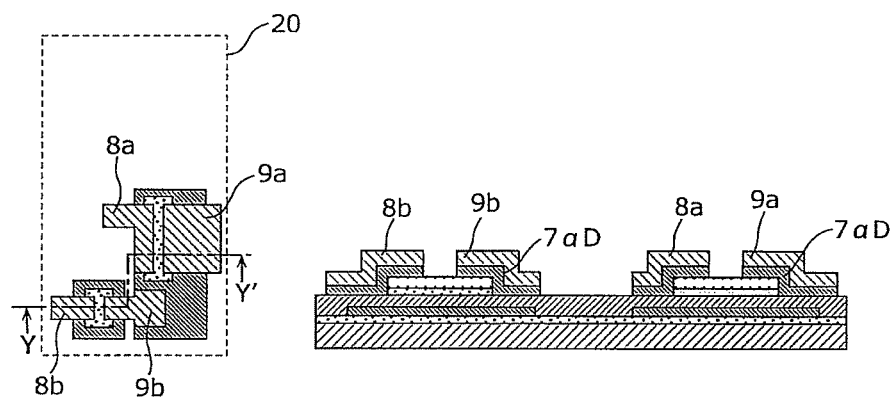
FIG. 14L is a plan view and a cross-sectional view schematically showing a source-drain electrode forming process in the method of manufacturing the thin-film transistor array device according to an embodiment of the present invention.
Figure 14M:
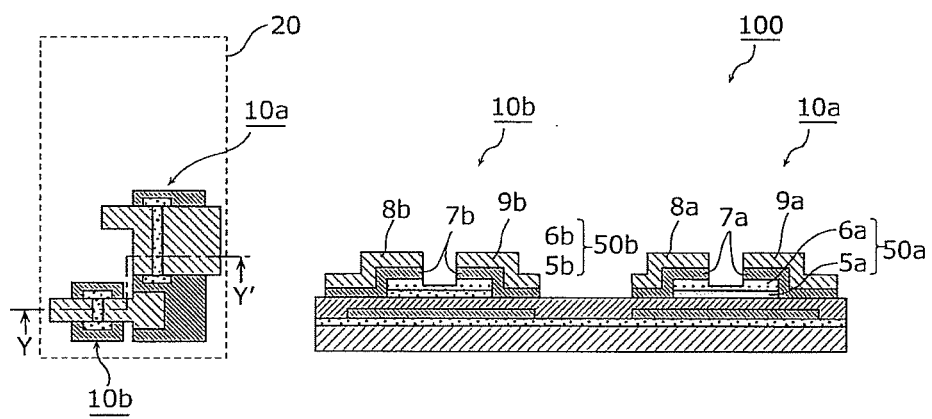
FIG. 14M is a plan view and a cross-sectional view schematically showing a channel portion etching process in the method of manufacturing the thin-film transistor array device according to an embodiment of the present invention.

Next, as shown in FIG. 14L, the source-drain metal film 8M and the impurity-doped amorphous semiconductor film 7aD are patterned by photolithography and wet etching. With this, the first source electrode 8a and the first drain electrode 9a, and the second source electrode 8b and the second drain electrode 9b are formed (S60).

Subsequently, with the resist (shown) for patterning the source-drain metal film 8M left unremoved, as shown in FIG. 14L, a top portion of the first noncrystalline semiconductor film 6a and the second noncrystalline semiconductor film 6b is etched by dry etching. This allows separating the impurity-doped amorphous semiconductor film 7aD, to form the pair of the first contact layers 7a and the pair of the second contact layers 7b that are $n^+$ layers. In addition, by etching the top layer of the amorphous semiconductor film 7aD, it is possible to form the first channel portion 50a and the second channel portion 50b each of which has a desired film thickness.

This allows manufacturing of the thin-film transistor array device 100 according to an embodiment of the present invention.

It should be noted that each specific process is not shown, but subsequently, as shown in FIG. 12, it is possible to manufacture an organic EL display device by forming: the first interlayer insulating film 310, the second interlayer insulating film 320, the first contact layer 330, the second contact portion 340, the bank 350, the lower electrode 360, the organic EL layer 370 and the upper electrode 380, and the source line 21, the power supply line 22, and the gate line 23.

Figure 15:
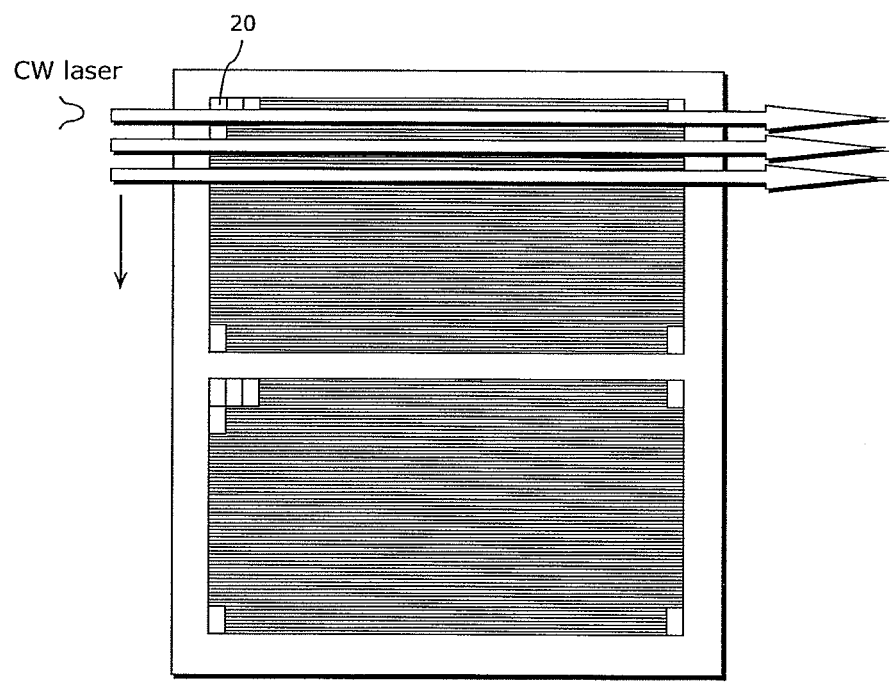
FIG. 15 is a diagram related to the method of manufacturing the thin-film transistor array device according to an embodiment of the present invention and schematically showing a state in which beam scanning is performed across an entire display unit.

Although the description above has been based on one pixel, it is possible to form, likewise, the thin-film transistor array device included in another pixel. The following will describe the beam scanning method using the CW laser, which is performed across an entire display unit including a plurality of pixels. FIG. 15 is a diagram related to the method of manufacturing the thin-film transistor array device according to an embodiment of the present invention and schematically showing a state in which beam scanning is performed across the entire display unit.

As shown in FIG. 15, the beam scanning method using the long-axis Gaussian CW laser beam in the present embodiment described above is to perform laser irradiation, on a per-line basis, on the plurality of pixels 20 arranged in a matrix made up of lines and columns. In this processing, as described in FIG. 14G, the laser irradiation is performed such that the noncrystalline semiconductor film 5a at the portion that is to be the first crystalline semiconductor film 5a in the driving TFT 10a is irradiated with the laser beam inner region $W_{IN}$ in the light intensity distribution of the CW laser beam. In addition, the laser irradiation is performed such that the noncrystalline semiconductor film 5a at the portion that is to be the second crystalline semiconductor film 5b in the switching TFT 10b is irradiated with the laser beam outer region $W_{OUT}$ in the light intensity distribution of the CW laser beam.

It should be noted that in the present embodiment, sequential scanning is unidirectionally performed from left to right, but the scanning may be performed turning in an opposite direction at an end of each line, that is, by scanning the first line from left to right, and scanning the next second line from right and left. However, this requires adjustment of the light intensity distribution of the CW laser beam to achieve such crystallization as described above in the driving TFT 10a and the switching TFT 10b.

Figure 16:
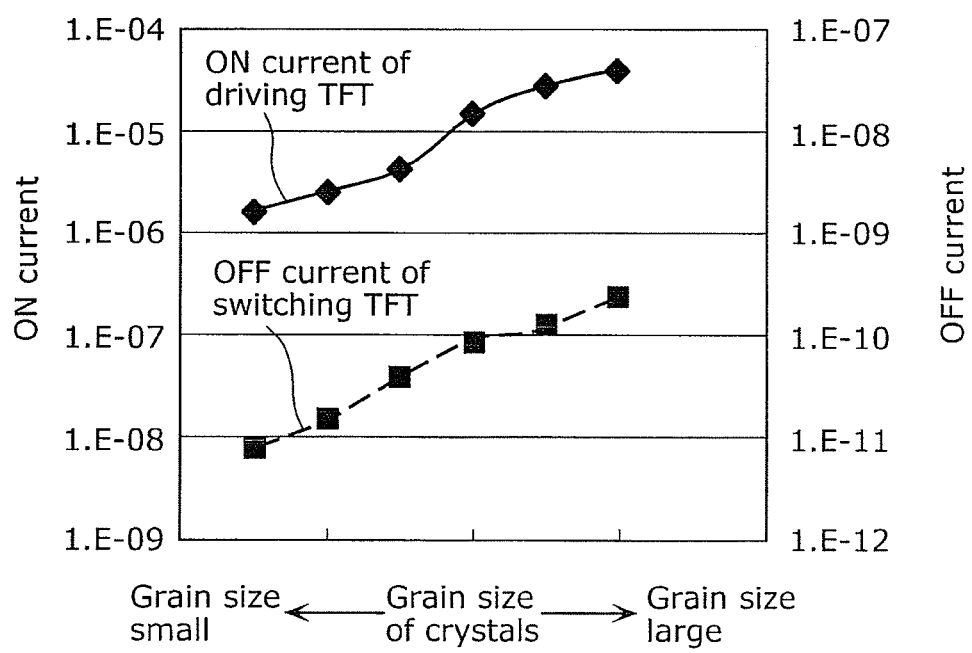
FIG. 16 is a diagram showing current characteristics with respect to crystal grain size in the thin-film transistor array device according to an embodiment of the present invention.

Next, current characteristics of the thin-film transistor array device 100 manufactured according to the manufacturing method of the present embodiment will be described with reference to FIG. 16. FIG. 16 is a diagram showing current characteristics with respect to the grain size of crystals in the thin-film transistor array device according to an embodiment of the present invention.

As shown in FIG. 16, in the thin-film transistor array device 100 according to the present embodiment, it is possible to form, in the first channel portion 50*a* in the driving TFT 10*a*, the first crystalline semiconductor film 5*a* having a relatively large average grain size of 40 μm to 60 μm, thus allowing increasing the ON current of the driving TFT. In addition, it is possible to form, in the second channel portion 50*b* in the switching TFT 10*b*, the second crystalline semiconductor 5*b* having a relatively small average grain size of 25 μm to 35 μm, thus allowing reducing the OFF current of the switching TFT 10*b*.

As described above, according to the method of manufacturing the thin-film transistor array device 100 in the present embodiment, it is possible to form, at the same time, the driving TFT 10*a* having high ON current and the switching TFT 10*b* having low OFF current.

Figure 17A:
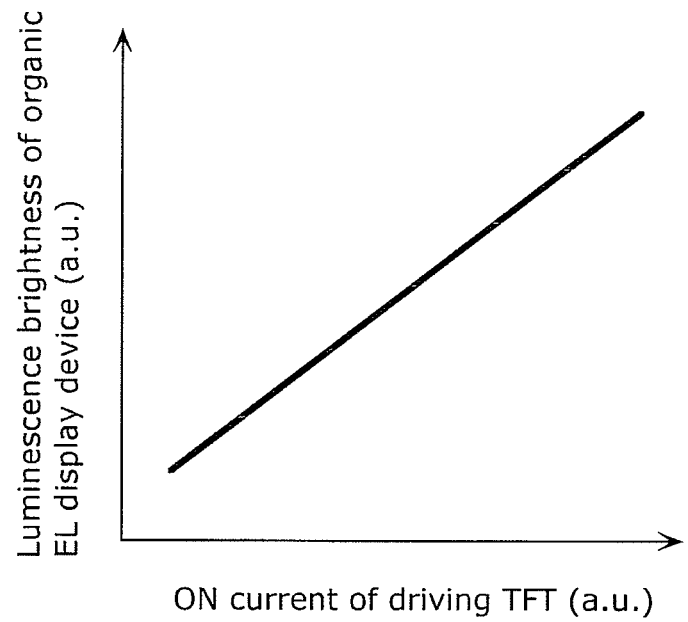
FIG. 17A is a diagram showing a relationship between ON current of the driving TFT and luminescence brightness of an organic EL display device.
Figure 17B:
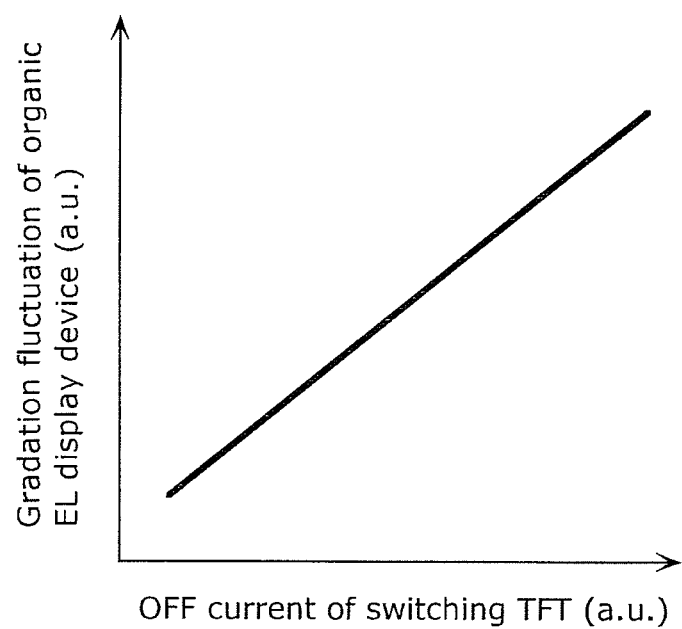
FIG. 17B is a diagram showing a relationship between OFF current of the switching TFT and gradation fluctuation of an organic EL display device.

Next, the relationship between display performance of the organic EL display device and each of the ON current of the driving TFT 10*a* and the OFF current of the switching TFT 10*b* will be described with reference to FIGS. 17A and 17B. FIG. 17A is a diagram showing a relationship between the ON current of the driving TFT and luminescence brightness of an organic EL display device. In addition, FIG. 17B is a diagram showing a relationship between the OFF current of the switching TFT and gradation fluctuation of an organic EL display device.

As shown in FIG. 17A, the luminescence brightness of the organic EL display device increases as the ON current of the driving TFT 10*a* increases. In addition, as shown in FIG. 17B, the gradation fluctuation in the organic EL display device decreases as the OFF current of the switching TFT 10*b* decreases. Such decrease in gradation fluctuation is caused by the decrease in the fluctuation of the gate voltage of the driving TFT 10*a*, which is caused by the decrease in the OFF current of the switching TFT 10*b*.

Thus, the organic EL display device 300 including the thin-film transistor array device 100 according to the present embodiment allows, as described earlier, increasing the ON current of the driving TFT 10*a*, thus allowing increasing luminescence brightness of the organic EL display device 300. In addition, since it is possible to reduce the OFF current of the switching TFT 10*b*, it is possible to reduce gradation fluctuation in the organic EL display device 300. With this, it is possible to obtain the organic EL display device 300 which can display a high-quality image.

Figure 18:
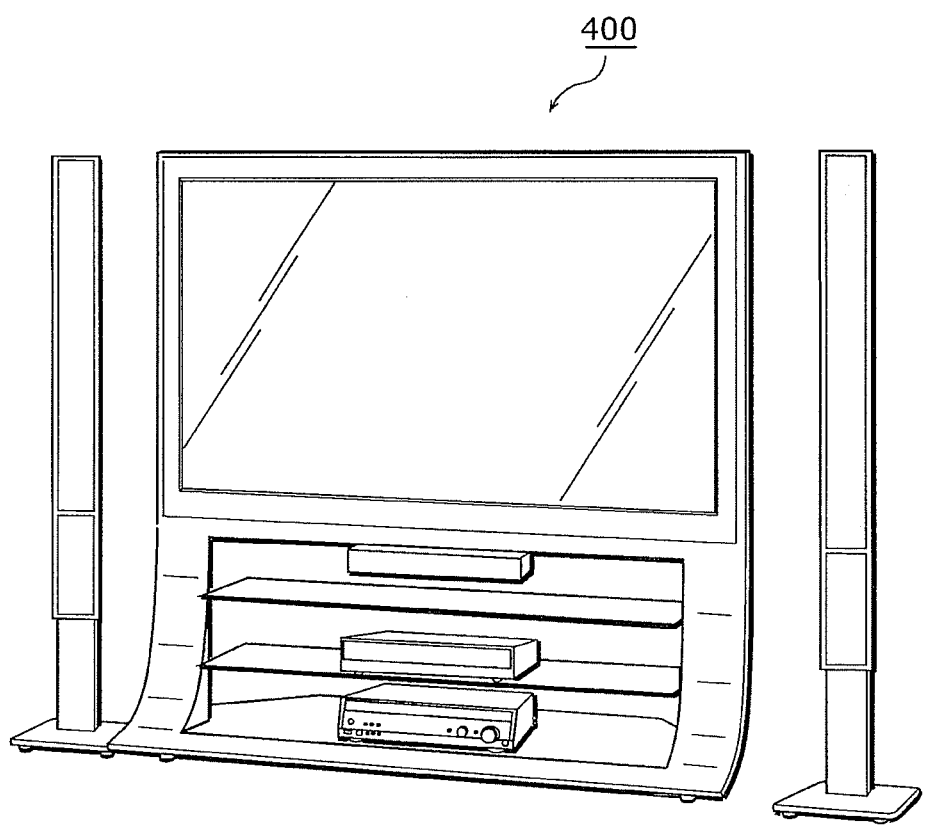
FIG. 18 is an external view of a device including a built-in display panel device according to an embodiment of the present invention.

As described above, the organic EL display device 300 according to an embodiment of the present invention can be used as a flat panel display and so on. For example, the organic EL display device 300 is applicable to a variety of display devices such as a television set 400 as shown in FIG. 18, a cellular phone, or a personal computer.

Thus far, the thin-film transistor array device, the organic EL display device, and the method of manufacturing the thin-film transistor array device have been described according to an embodiment of the present invention, but the present invention is not limited to this embodiment. For example, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

A thin-film transistor array device and an organic EL display device according to an implementation of the present invention are widely usable in electrical devices such as a display device incorporated in a television set, a personal computer, and a cellular phone.

What is claimed is:

1. A thin-film transistor array device comprising:
a substrate;
a first gate electrode provided above said substrate;
a second gate electrode provided above said substrate and in parallel with said first gate electrode;
a gate insulating film provided on said first gate electrode and second gate electrode;
a first crystalline semiconductor film provided on said gate insulating film and above said first gate electrode, said first crystalline semiconductor film being made of silicon and including crystal grains having a first average grain size;
a first source electrode and a first drain electrode which are formed above said first crystalline semiconductor film;
a second crystalline semiconductor film provided on said gate insulating film and above said second gate electrode, said second crystalline semiconductor film being made of silicon and including crystal grains having a second average grain size which is smaller than the first average grain size; and
a second source electrode and a second drain electrode which are formed above said second crystalline semiconductor film,
wherein the crystal grains of said first crystalline semiconductor film are formed by:
a first process of irradiating, with a continuous wave laser, a noncrystalline semiconductor film made of silicon such that a temperature of the noncrystalline semiconductor film is within a temperature range of 600° C. to 1100° C., the continuous wave laser having a continuous light intensity distribution that is convex upward in each of long and short axes;
a second process of crystallizing the noncrystalline semiconductor film according to the temperature range of 600° C. to 1100° C.; and
a third process of increasing a grain size of the crystal grains of the noncrystalline semiconductor film that becomes crystallized according to a temperature range of 1100° C. to 1414° C., when the temperature of the noncrystalline semiconductor film increases from 1100° C. to 1414° C. due to latent heat which is generated when the noncrystalline semiconductor film becomes crystallized by the laser irradiation,
the continuous light intensity distribution that is convex upward in the long axis is predetermined such that a portion in which the temperature of the noncrystalline semiconductor film increases from 1100° C. to 1414° C. due to the latent heat has a constant width,
in the third process, the crystal grains of said first crystalline semiconductor film are further formed using an inner region having the constant width, the inner region being included in the continuous light intensity distribution that is convex upward in the long axis and is predetermined as having the constant width,
the crystal grains of said second crystalline semiconductor film are formed according to the same processing as in the first and second processes, using the laser irradiation performed in the first and second processes, and the crystal grains of said second crystalline semiconductor film are further formed using an outer region which is located outside the inner region having the constant width, the outer region being included in the continuous light intensity distribution that is convex upward in the long axis and is predetermined as having the constant width.

2. The thin-film transistor array device according to claim 1,
wherein, when maximum light intensity in the light intensity distribution is 100%,
the inner region having the constant width in the light intensity distribution has a range of light intensity of 80% or above, and
the outer region that is located outside the inner region having the constant width in the light intensity distribution has a range of light intensity from 50% to below 80%.

3. The thin-film transistor array device according to claim 1,
wherein the first average grain size is from 40 nm to 60 nm.

4. The thin-film transistor array device according to claim 1,
wherein the second average grain size is from 25 nm to 35 nm.

5. The thin-film transistor array device according to claim 1,
wherein said first crystalline semiconductor film includes mixed crystal having a noncrystalline structure and a crystalline structure.

6. The thin-film transistor array device according to claim 1,
wherein said second crystalline semiconductor film includes mixed crystal having a noncrystalline structure and a crystalline structure.

7. The thin-film transistor array device according to claim 1,
wherein said second source electrode and said second drain electrode are electrically connected to said first gate electrode.

8. An organic EL display device including the thin-film transistor array device according to claim 1, said organic EL display device comprising:
a thin-film transistor array substrate on which said thin-film transistor array device is provided in each of a plurality of pixels;
an interlayer insulating film provided above said thin-film transistor array substrate;
a lower electrode provided, in each of the plurality of pixels, above said interlayer insulating film;
a contact connecting said thin-film transistor array device and said lower electrode;
a bank provided above said interlayer insulating film and having an opening;
an organic luminescent layer formed in the opening of said bank; and
an upper electrode provided above said organic luminescent layer,
wherein said first crystalline semiconductor film included in said thin-film transistor array device is included in a channel layer of a driving transistor in a drive circuit which controls luminescence of the pixels, and
said second crystalline semiconductor film included in said thin-film transistor array device is included in a channel layer of a switching transistor in the drive circuit.

9. A method of manufacturing a thin-film transistor array device, comprising:
a first process of preparing a substrate;
a second process of forming a first gate electrode above the substrate;
a third process of forming a second gate electrode above the substrate and in parallel with the first gate electrode;
a fourth process of forming a gate insulating film on the first gate electrode and second gate electrode;
a fifth process of forming, at the same time, a first crystalline semiconductor film on the gate insulating film and above the first gate electrode, and a second crystalline semiconductor film on the gate insulating film and above the second gate electrode, the first crystalline semiconductor film being made of silicon and including crystal grains having a first average grain size, and the second crystalline semiconductor film being made of silicon and including crystal grains having a second average grain size which is smaller than the first average grain size; and
a sixth process of forming a first source electrode and a first drain electrode above the first crystalline semiconductor film, and forming a second source electrode and a second drain electrode above the second crystalline semiconductor film,
wherein in said fifth process, the crystal grains of the first crystalline semiconductor film are formed by:
a 5-1 process of irradiating, with a continuous wave laser, a noncrystalline semiconductor film made of silicon such that a temperature of the noncrystalline semiconductor film is within a temperature range of 600° C. to 1100° C., the continuous wave laser having a continuous light intensity distribution that is convex upward in each of long and short axes;
a 5-2 process of crystallizing the noncrystalline semiconductor film according to the temperature range of 600° C. to 1100° C.; and
a 5-3 process of increasing a grain size of the crystal grains of the noncrystalline semiconductor film crystallized according to a temperature range of 1100° C. to 1414° C., when the temperature of the noncrystalline semiconductor film increases from 1100° C. to 1414° C. due to latent heat which is generated when the noncrystalline semiconductor film becomes crystallized by the laser irradiation,
the continuous light intensity distribution that is convex upward in the long axis is predetermined such that a portion in which the temperature of the noncrystalline semiconductor film increases from 1100° C. to 1414° C. due to the latent heat has a constant width,
in said 5-3 process, the crystal grains of the first crystalline semiconductor film are further formed using an inner region having the constant width, the inner region being included in the continuous light intensity distribution that is convex upward in the long axis and is predetermined as having the constant width,
the crystal grains of the second crystalline semiconductor film are formed according to the same processing as in said 5-1 and 5-2 processes, using the laser irradiation performed in said 5-1 and 5-2 processes, and
the crystal grains of the second crystalline semiconductor film are further formed using an outer region which is located outside the inner region having the constant width, the outer region being included in the continuous light intensity distribution that is convex upward in the long axis and is predetermined as having the constant width.

10. The method of manufacturing a thin-film transistor array device according to claim 9,
wherein, when maximum light intensity in the light intensity distribution is 100%,
the inner region having the constant width in the light intensity distribution has a range of light intensity of 80% or above, and
the outer region that is located outside the inner region having the constant width in the light intensity distribution has a range of light intensity from 50% to below 80%.

11. The method of manufacturing a thin-film transistor array device according to claim 9, further comprising
a process of spacing the first crystalline semiconductor film from the second crystalline semiconductor film, said process being performed between said 5-3 process and said sixth process.

12. The method of manufacturing a thin-film transistor array device according to claim 11,
wherein, in said process of spacing the first crystalline semiconductor film from the second crystalline semiconductor film, a boundary portion between the first crystalline semiconductor film and the second crystalline semiconductor film is removed by patterning.

13. The method of manufacturing a thin-film transistor array according to claim 9,
wherein the first average grain size is from 40 nm to 60 nm.

14. The method of manufacturing a thin-film transistor array device according to claim 9,
wherein the second average grain size is from 25 nm to 35 nm.

15. The method of manufacturing a thin-film transistor array device according to claim 9,
wherein the continuous light intensity distribution that is convex is a Gaussian distribution.

16. The method of manufacturing a thin-film transistor array device according to claim 9,
wherein, in said 5-1 process, the laser irradiation is performed on the noncrystalline semiconductor film such that the temperature of the noncrystalline semiconductor film is within the temperature range of 600° C. to 800° C.

17. The method of manufacturing a thin-film transistor array device according to claim 9,
wherein, in said 5-1 process, the laser irradiation is performed on the noncrystalline semiconductor film for microsecond-order time.

18. The method of manufacturing a thin-film transistor array device according to claim 17,
wherein, in said 5-1 process, the laser irradiation to the noncrystalline semiconductor film is performed for 10 to 100 microseconds.

19. A thin-film transistor array device comprising:
a substrate;
a first gate electrode provided above said substrate;
a second gate electrode provided above said substrate and in parallel with said first gate electrode;
a gate insulating film provided on said first gate electrode and second gate electrode;
a first crystalline semiconductor film provided on said gate insulating film and above said first gate electrode, said first crystalline semiconductor film including crystal grains having a first average grain size;
a first source electrode and a first drain electrode which are formed above said first crystalline semiconductor film;
a second crystalline semiconductor film provided on said gate insulating film and above said second gate electrode, said second crystalline semiconductor film including crystal grains having a second average grain size which is smaller than the first average grain size; and
a second source electrode and a second drain electrode which are formed above said second crystalline semiconductor film,
wherein the crystal grains of said first crystalline semiconductor film are formed by:
a first process of irradiating, with a continuous wave laser, a noncrystalline semiconductor film such that a temperature of the noncrystalline semiconductor film is within a first temperature range which is equal to or below a melting point of a noncrystalline semiconductor and in which the noncrystalline semiconductor becomes crystallized by solid-phase growth, the continuous wave laser having a continuous light intensity distribution that is convex upward in each of long and short axes;
a second process of crystallizing the noncrystalline semiconductor film according to the first temperature range; and
a third process of increasing a grain size of the crystal grains of the noncrystalline semiconductor film that becomes crystallized according to a second temperature range in which the temperature of the noncrystalline semiconductor film is equal to or above the melting point of the noncrystalline semiconductor and equal to or below the melting point of the crystalline semiconductor, when the temperature of the noncrystalline semiconductor film increases to a level within the second temperature range due to latent heat which is generated when the noncrystalline semiconductor film becomes crystallized by the laser irradiation,
the continuous light intensity distribution that is convex upward in the long axis is predetermined such that a potion in which the temperature of the noncrystalline semiconductor film increases to the level within the second temperature range due to the latent heat has a constant width,
in the third process, the crystal grains of said first crystalline semiconductor film are further formed using an inner region having the constant width, the inner region being included in the continuous light intensity distribution that is convex upward in the long axis and is predetermined as having the constant width,
the crystal grains of said second crystalline semiconductor film are formed according to the same processing as in the first and second processes, using the laser irradiation performed in the first and second processes, and
the crystal grains of said second crystalline semiconductor film are further formed using an outer region which is located outside the inner region having the constant width, the outer region being included in the continuous light intensity distribution that is convex upward in the long axis and is predetermined as having the constant width.

20. A method of manufacturing a thin-film transistor array device, comprising:
a first process of preparing a substrate;
a second process of forming a first gate electrode above the substrate;
a third process of forming a second gate electrode above the substrate and in parallel with the first gate electrode;
a fourth process of forming a gate insulating film on the first gate electrode and second gate electrode;
a fifth process of forming, at the same time, a first crystalline semiconductor film on the gate insulating film and above the first gate electrode, and a second crystalline semiconductor film on the gate insulating film and above the second gate electrode, the first crystalline semiconductor film including crystal grains having a first average grain size, and the second crystalline semiconductor film including crystal grains having a second average grain size which is smaller than the first average grain size; and a sixth process of forming a first source electrode and a first drain electrode above the first crystalline semiconductor film, and forming a second source electrode and a second drain electrode above the second crystalline semiconductor film, wherein in said fifth process, the crystal grains of the first crystalline semiconductor film are formed by:

a 5-1 process of irradiating, with a continuous wave laser, a noncrystalline semiconductor film such that a temperature of the noncrystalline semiconductor film is within a first temperature range which is equal to or below a melting point of a noncrystalline semiconductor and in which the noncrystalline semiconductor becomes crystallized by solid-phase growth, the continuous wave laser having a continuous light intensity distribution that is convex upward in each of long and short axes;

a 5-2 process of crystallizing the noncrystalline semiconductor film according to the first temperature range; and a 5-3 process of increasing a grain size of the crystal grains of the noncrystalline semiconductor film that becomes crystallized according to a second temperature range in which the temperature of the noncrystalline semiconductor film is equal to or above the melting point of the noncrystalline semiconductor and equal to or below the melting point of the crystalline semiconductor, when the temperature of the noncrystalline semiconductor film increases to a level within the second temperature range due to latent heat which is generated when the noncrystalline semiconductor film becomes crystallized by the laser irradiation, the continuous light intensity distribution that is convex upward in the long axis is predetermined such that a potion in which the temperature of the noncrystalline semiconductor film increases to the level within the second temperature range due to the latent heat has a constant width, in said 5-3 process, the crystal grains of the first crystalline semiconductor film are further formed using an inner region having the constant width, the inner region being included in the continuous light intensity distribution that is convex upward in the long axis and is predetermined as having the constant width, the crystal grains of the second crystalline semiconductor film are formed according to the same processing as in said 5-1 and 5-2 processes, using the laser irradiation performed in said 5-1 and 5-2 processes, and the crystal grains of said second crystalline semiconductor film are further formed using an outer region which is located outside the inner region having the constant width, the outer region being included in the continuous light intensity distribution that is convex upward in the long axis and is predetermined as having the constant width.

* * * * *